(12) United States Patent
Zhou et al.

(10) Patent No.: US 12,062,573 B2
(45) Date of Patent: Aug. 13, 2024

(54) METHOD FOR FORMING BARRIER LAYER IN SEMICONDUCTOR STRUCTURE

(71) Applicant: YANGTZE MEMORY TECHNOLOGIES CO., LTD., Wuhan (CN)

(72) Inventors: Peng Zhou, Wuhan (CN); Shuliang Lv, Wuhan (CN); Ge Mao, Wuhan (CN); Yuan Li, Wuhan (CN); Rui Song, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 696 days.

(21) Appl. No.: 17/186,487

(22) Filed: Feb. 26, 2021

(65) Prior Publication Data

US 2022/0238372 A1 Jul. 28, 2022

Related U.S. Application Data

(63) Continuation of application No. PCT/CN2021/074005, filed on Jan. 27, 2021.

(51) Int. Cl.
*H01L 21/768* (2006.01)
*C23C 16/30* (2006.01)
(Continued)

(52) U.S. Cl.
CPC ...... *H01L 21/76856* (2013.01); *C23C 16/303* (2013.01); *C23C 16/45527* (2013.01);
(Continued)

(58) Field of Classification Search
CPC ............ C23C 16/303; C23C 16/45527; C23C 16/45546; H10B 41/27; H10B 41/35;
(Continued)

(56) References Cited

U.S. PATENT DOCUMENTS 7,078,810 B2 * 7/2006 Wang ................ H01L 21/31625
257/E21.171
8,759,234 B2 * 6/2014 Chang ............... H01L 21/02175
438/785
(Continued)

FOREIGN PATENT DOCUMENTS

CN 101174577 A 5/2008
CN 103050376 A 4/2013
(Continued)

OTHER PUBLICATIONS

Office action issued in corresponding Chinese Application No. 202180000354.4, mailed May 7, 2022, 15 pages.
(Continued)

*Primary Examiner* — Bilkis Jahan
*Assistant Examiner* — Victor V Barzykin
(74) *Attorney, Agent, or Firm* — BAYES PLLC

(57) ABSTRACT

A method for forming a barrier layer in a semiconductor structure is disclosed. A substrate having a dielectric layer is provided. The dielectric layer is exposed to a precursor having a first metal, and a first ammonia treatment is performed. A first purge operation is performed, a second ammonia treatment is performed after the first purge operation, and a second purge operation is performed after the second ammonia treatment to form the barrier layer on the dielectric layer.

20 Claims, 16 Drawing Sheets

(51) Int. Cl.
  *C23C 16/455* (2006.01)
  *H01L 21/28* (2006.01)
  *H01L 21/285* (2006.01)
  *H01L 21/67* (2006.01)
  *H10B 41/27* (2023.01)
  *H10B 41/35* (2023.01)
  *H10B 43/27* (2023.01)
  *H10B 43/35* (2023.01)

(52) U.S. Cl.
  CPC .. *C23C 16/45546* (2013.01); *H01L 21/28562* (2013.01); *H01L 21/28568* (2013.01); *H01L 21/67011* (2013.01); *H01L 21/76829* (2013.01); *H01L 21/76843* (2013.01); *H10B 41/27* (2023.02); *H10B 41/35* (2023.02); *H10B 43/27* (2023.02); *H10B 43/35* (2023.02); *H01L 29/40117* (2019.08)

(58) Field of Classification Search
  CPC ... H10B 43/27; H10B 43/35; H01L 21/28562; H01L 21/76843; H01L 21/76856; H01L 21/28568
  See application file for complete search history.

(56) References Cited

U.S. PATENT DOCUMENTS

| | | | | |
|---|---|---|---|---|
| 9,583,400 | B1* | 2/2017 | Bao | H01L 21/28088 |
| 10,991,805 | B2* | 4/2021 | Tai | H01L 21/823431 |
| 2002/0106846 | A1* | 8/2002 | Seutter | H01L 21/28562 |
| | | | | 257/E21.171 |
| 2003/0124262 | A1* | 7/2003 | Chen | H01L 21/28562 |
| | | | | 257/E21.171 |
| 2005/0009325 | A1* | 1/2005 | Chung | C23C 16/02 |
| | | | | 438/653 |
| 2007/0020923 | A1* | 1/2007 | Kraus | H01L 21/28562 |
| | | | | 257/E21.171 |
| 2017/0373079 | A1* | 12/2017 | Sharangpani | H10B 41/27 |
| 2019/0221575 | A1* | 7/2019 | Dong | H01L 21/0262 |
| 2019/0252405 | A1* | 8/2019 | Tsutsumi | G11C 16/0466 |
| 2019/0273145 | A1* | 9/2019 | Chiu | H01L 21/28088 |
| 2019/0304790 | A1* | 10/2019 | Mousa | C23C 16/34 |
| 2020/0144056 | A1* | 5/2020 | Lei | H01L 21/02491 |
| 2020/0263297 | A1* | 8/2020 | Jussila | H01L 21/02205 |
| 2021/0036147 | A1* | 2/2021 | Wang | H01L 21/76849 |
| 2021/0090877 | A1* | 3/2021 | Chen | H01L 21/02186 |
| 2021/0351071 | A1* | 11/2021 | Liu | H01L 21/76856 |
| 2021/0407795 | A1* | 12/2021 | Kim | H01L 28/40 |
| 2022/0238372 | A1* | 7/2022 | Zhou | C23C 16/45546 |

FOREIGN PATENT DOCUMENTS

| | | |
|---|---|---|
| CN | 108604595 A | 9/2018 |
| CN | 110783182 A | 2/2020 |
| CN | 111211048 A | 5/2020 |
| CN | 111564450 A | 8/2020 |

OTHER PUBLICATIONS

International Search Report issued in corresponding International Application No. PCT/CN2021/074005, mailed Nov. 3, 2021, 4 pages.

* cited by examiner

800

| 802 | Forming a dielectric stack on a substrate, the dielectric stack comprising a plurality of first dielectric layers and a plurality of second dielectric layers, and the first dielectric layers and the second dielectric layers being alternately formed on the substrate |

↓

| 804 | Forming a slit in the dielectric stack to vertically separate the dielectric stack to a plurality of arrays |

↓

| 806 | Removing the second dielectric layers in the dielectric stack |

↓

| 808 | Performing a first deposition process to form a barrier layer on the first dielectric layers using an atomic layer deposition (ALD) process |

| 8082 | Exposing the dielectric stack to a precursor having a first metal |

↓

| 8084 | Performing the plurality of pulse-type nitridation operations to form the barrier layer on the first dielectric layers |

FIG. 8B

METHOD FOR FORMING BARRIER LAYER IN SEMICONDUCTOR STRUCTURE

CROSS-REFERENCE TO RELATED APPLICATIONS

This application is continuation of International Application No. PCT/CN2021/074005, filed on Jan. 27, 2021, entitled "METHOD FOR FORMING BARRIER LAYER IN SEMICONDUCTOR STRUCTURE," which is hereby incorporated by reference in its entirety.

BACKGROUND

The present disclosure relates to a semiconductor process for forming a semiconductor structure.

Thin conductive films are used in the fabrication of integrated circuits to route signals through and between many of the device elements of an integrated circuit, including interconnect lines, capacitor and gate electrodes, and contacts to the source and drain transistor regions. Generally, interconnect lines are fabricated from metal materials, such as tungsten (W), aluminum (Al), or copper (Cu), and are embedded in dielectric insulation layers. For improving the device performance, low dielectric constant (low-K) materials are also used in the semiconductor process to lower the signal propagation time delay.

A barrier layer is employed to prevent the diffusion of impurities, such as hydrogen and fluorine, from metal lines into memory stack structures. The barrier material and deposition method need to be carefully designed to avoid compromising the resistivity and reliability of the interconnect system.

SUMMARY

In one aspect, a method for forming a barrier layer in a semiconductor structure is disclosed. A substrate having a dielectric layer is provided. The dielectric layer is exposed to a precursor having a first metal, and a pulse-type nitridation operation is performed. The pulse-type nitridation operation includes performing a first ammonia treatment. A first purge operation is performed, a second ammonia treatment is performed after the first purge operation, and a second purge operation is performed after the second ammonia treatment to form the barrier layer on the dielectric layer.

In another aspect, a method for manufacturing a three-dimensional (3D) memory device is disclosed. A dielectric stack is formed on a substrate, the dielectric stack includes a plurality of first dielectric layers and a plurality of second dielectric layers, and the first dielectric layers and the second dielectric layers are alternately formed on the substrate. A slit is formed in the dielectric stack to vertically separate the dielectric stack to a plurality of arrays. The second dielectric layers in the dielectric stack are removed, and a first deposition process is performed to form a barrier layer on the first dielectric layers. The first deposition process includes an atomic layer deposition (ALD) process having the dielectric stack exposed to a precursor having a first metal, and a plurality of pulse-type nitridation operations performed to form the barrier layer on the first dielectric layers.

In still another aspect, a method for forming a semiconductor device is disclosed. A substrate is provided. A barrier layer is formed on the substrate using an ALD process with a plurality of pulse-type nitridation operations.

In yet another aspect, a semiconductor manufacturing device is disclosed. The semiconductor manufacturing device includes a reaction chamber, a substrate holder located in the reaction chamber to hold a substrate, a precursor source connected to the reaction chamber through a gas line, an ammonia source with a pressure above 200 Torrs connected to the reaction chamber through the gas line, and a dinitrogen source connected to the reaction chamber through the gas line. The precursor source, the ammonia source, and the dinitrogen source are configured to perform an ALD process to form a barrier layer on the substrate, and the ammonia source and the dinitrogen source are configured to perform a plurality of pulse-type nitridation operations in the ALD process.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

FIGS. 8A-8B are flowcharts of an exemplary method for manufacturing a semiconductor device, according to some aspects of the present disclosure.

Figure 1:
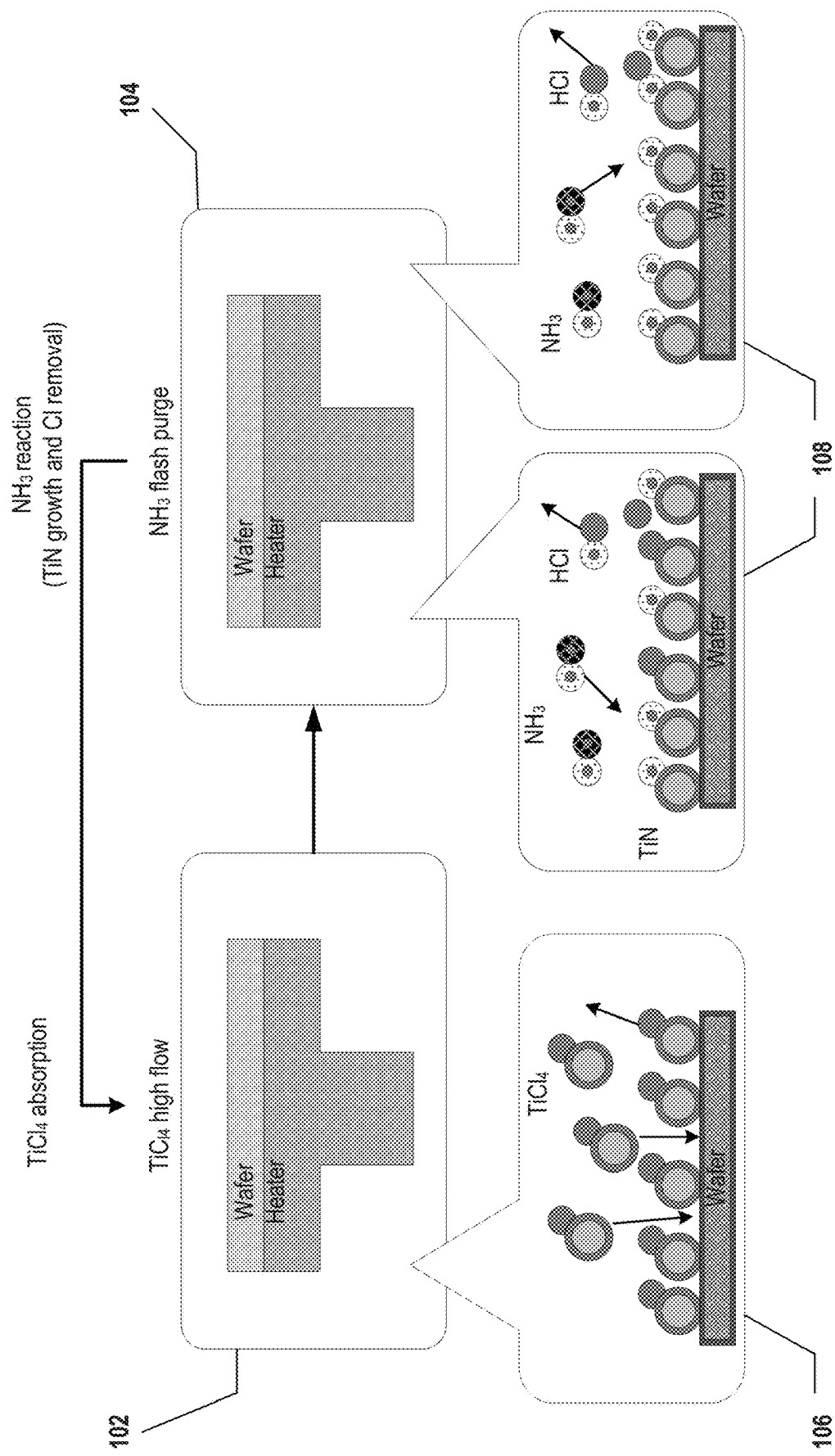
FIG. 1 illustrates an exemplary barrier layer deposition process, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means perpendicular to the lateral surface of a substrate.

One important aspect of 3D memory development is the increase in the number of memory cells, requiring an increase in integration level at all. An application to memory production is a multiplication of the number of metal lines, such as word lines or bit lines, resulting in a higher stair structure and increased thickness. Therefore, it is particularly important to reduce the thickness of the whole memory structure when increasing the number of layers of metal lines.

The height reduction cannot be at the expense of the resistivity of the metal lines. In other words, the thickness of the metal electrodes or metal lines (such as tungsten) should be kept unchanged. Therefore, reducing the thickness of the metal barrier layers becomes one of the choices. Furthermore, the continuity and the compactness of the barrier layers is another important factor to prevent the fluorine impurities in the metal lines causing leakage through the barrier layer in a subsequent high-temperature process.

To address the aforementioned issues, the present disclosure introduces a solution in which the thickness reduction and leakage prevention can be balanced in forming a barrier layer in a semiconductor structure.

FIG. 1 illustrates an exemplary barrier layer deposition process, according to some aspects of the present disclosure. In FIG. 1, $TiCl_4$ is used as the precursor, and $NH_3$ is used as the ammonia source to explain the present disclosure; however, the precursor and the ammonia source are not limited to these materials. For example, the precursor may be $TaCl_5$, $TaF_5$, $TaBr_5$, $TiCl_4$, $TiBr_4$, $TiI_4$, or $TiF_4$, and the ammonia source may be $NH_3$, $N_2H_4$, $N_2H_2$, or other suitable ammonia gas.

As the number of operations in the stair memory structure increases, the $TiCl_4$ flow rate for forming the barrier layer might be increased to improve the operation coverage. The high $TiCl_4$ flow rate might also have more Cl atoms hidden in the barrier layer and cause the defects in the barrier layer. Furthermore, the crystal structure and barrier properties of the barrier layer might be further worsened if the thickness of the barrier layer is reduced. When the $TiCl_4$ flow rate is increased, the increased Cl atoms might be removed by extending the nitridation time. However, when extending the nitridation time, the operation coverage might be affected because the extended nitridation time might convert the atomic layer deposition (ALD) process into the chemical vapor deposition (CVD) process. In the present disclosure, as shown in FIG. 1, a wafer is placed on a heater in the reaction chamber. The heater is used to heat and maintain the temperature of the wafer to a preset process temperature. $TiCl_4$ absorption operation 102 includes high flow $TiCl_4$ operation 106. During the $TiCl_4$ absorption operation 102, a high flow $TiCl_4$ is provided in the reaction chamber and $TiCl_4$ is absorbed or deposited on the wafer. During the nitridation operation 104, $NH_3$ is provided in the reaction chamber. Nitridation operation 104, including the ammonia treatments and the purge operations, utilizes the $NH_3$ flow of multiple pulse-type nitridation operation 108 to react with $TiCl_4$. The multiple pulse-type nitridation operation 108 includes repeating high $NH_3$ pressure and short process time ammonia treatments followed by the purge operations. $TiCl_4$ absorption operation 102 and pulse-type nitridation operation 108 may be repeated several times to form a sufficient thickness of the barrier layer. Details of pulse-type nitridation operation 108 are described thoroughly below in FIGS. 2A-2F. As shown in FIG. 1, pulse-type nitridation operation 108 is repeated twice; however, the repeating times of pulse-type nitridation operation 108 is not limited to twice and could be modified or increased according to actual requirements.

Hence, the Cl atoms in the barrier layer could be gradually removed and scrubbed in the multiple pulse-type nitridation operation 108. The impurity content in the barrier layer is lowered, and the barrier properties are therefore ensured and improved. In some implementations, pulse-type nitridation operation 108 includes using high ammonia pressure above 200 Torrs. In some implementations, the ammonia pressure may be between 200 Torrs and 250 Torrs. In some implementations, the ammonia pressure may be between 210 Torrs and 230 Torrs. In some implementations, the processing time of the ammonia treatment may be less than 0.4 seconds. In some implementations, the processing time of the ammonia treatment may be between 0.1-0.4 seconds. In some implementations, the processing time of the ammonia treatment may be between 0.2-0.4 seconds.

Figure 2A:
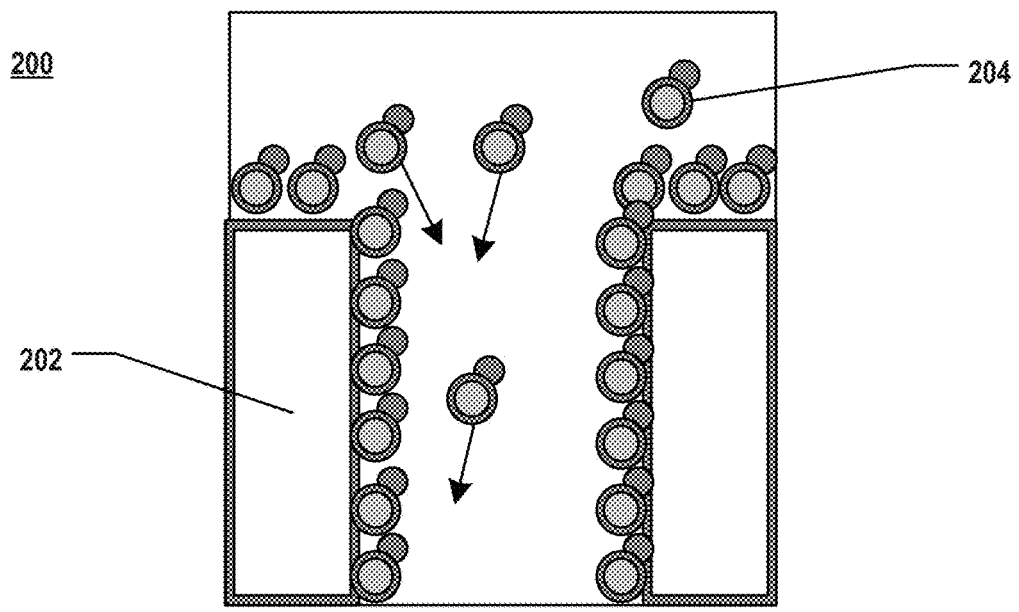
FIGS. 2A-2F illustrate cross-sections of an exemplary semiconductor structure, according to some aspects of the present disclosure.
Figure 2B:
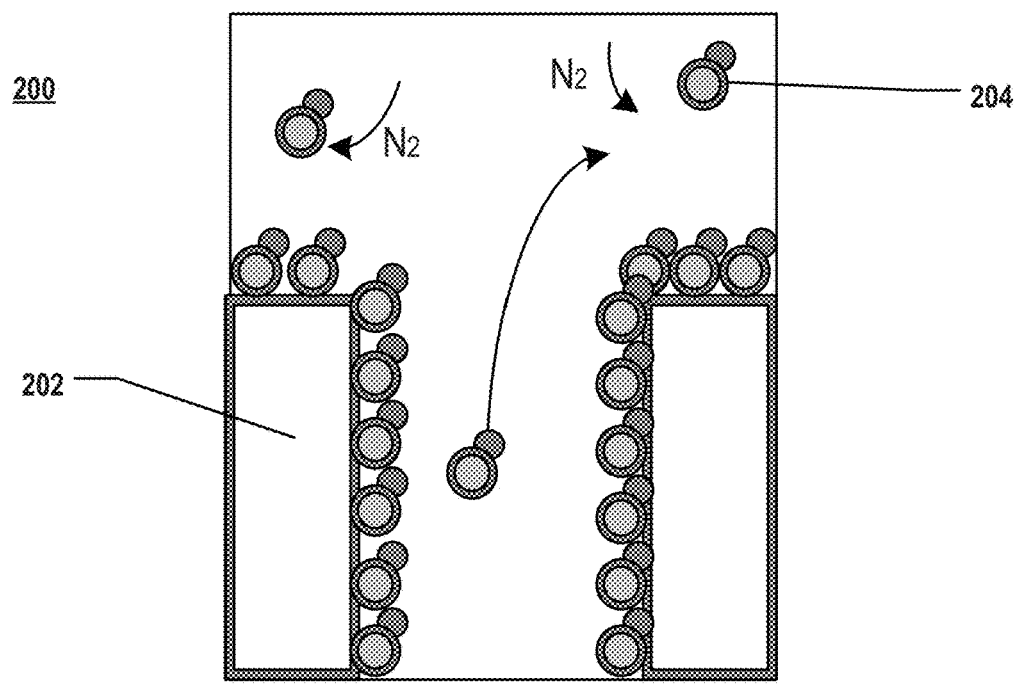
Figure 2C:
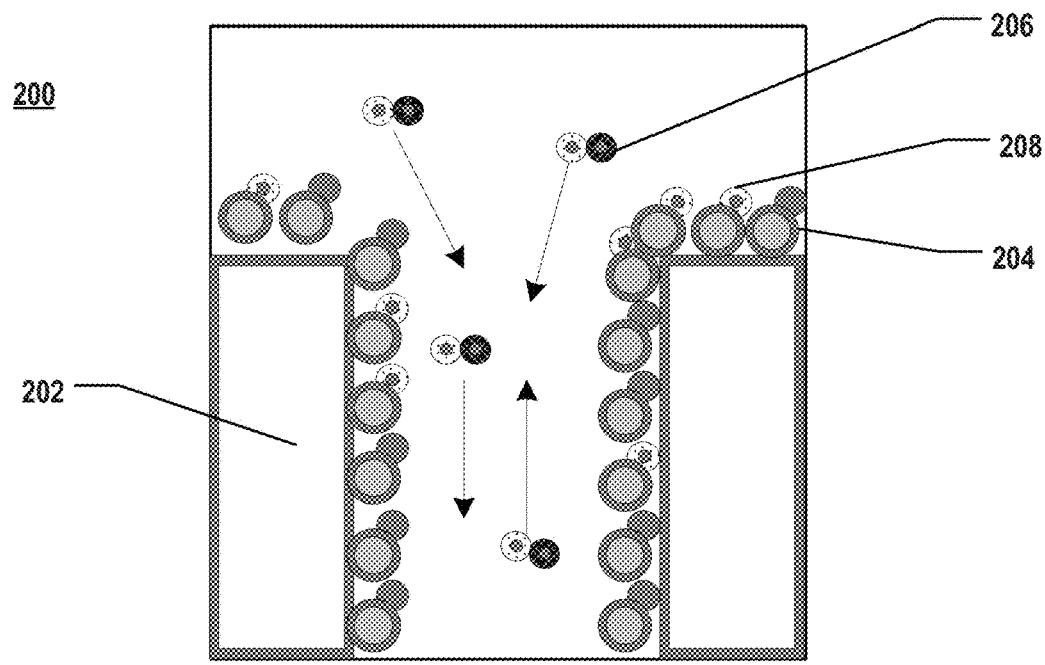
Figure 2D:
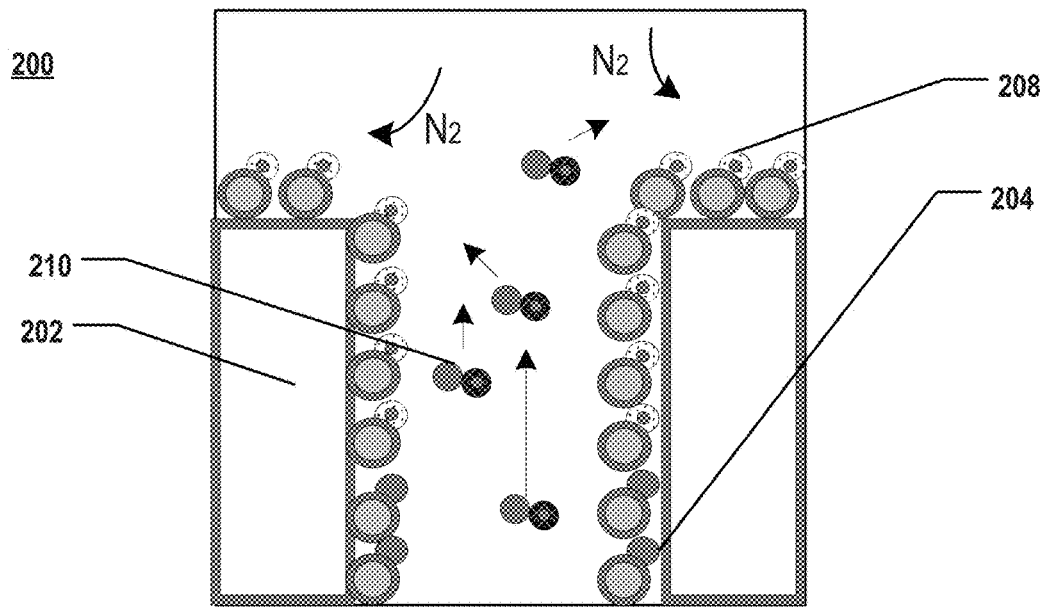
Figure 2E:
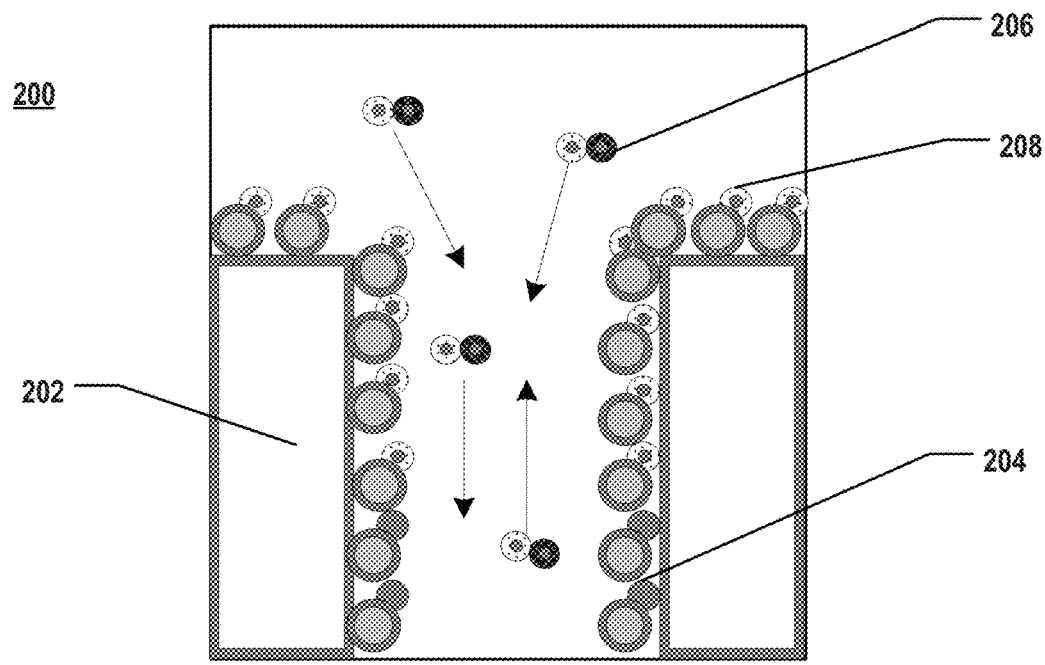
Figure 2F:
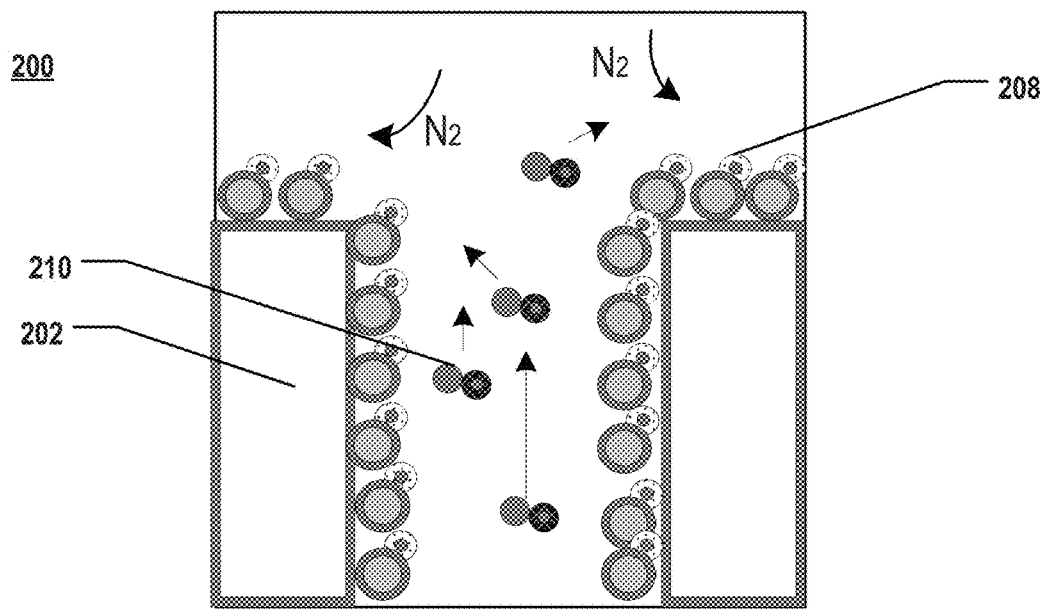
Figure 3A:
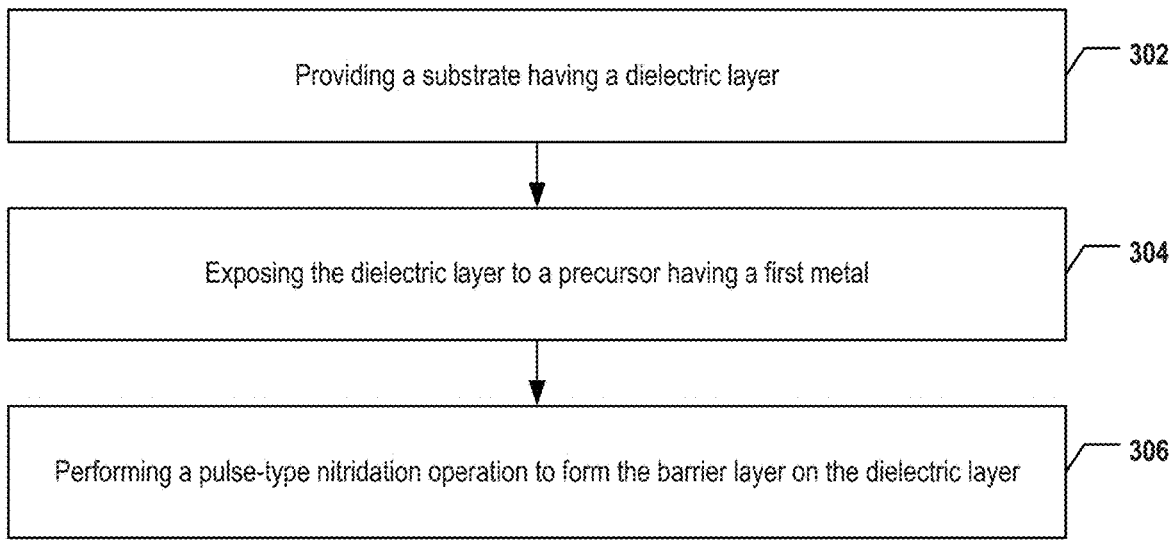
FIGS. 3A-3B are flowcharts of an exemplary method for forming a barrier layer in a semiconductor structure, according to some aspects of the present disclosure.
Figure 3B:
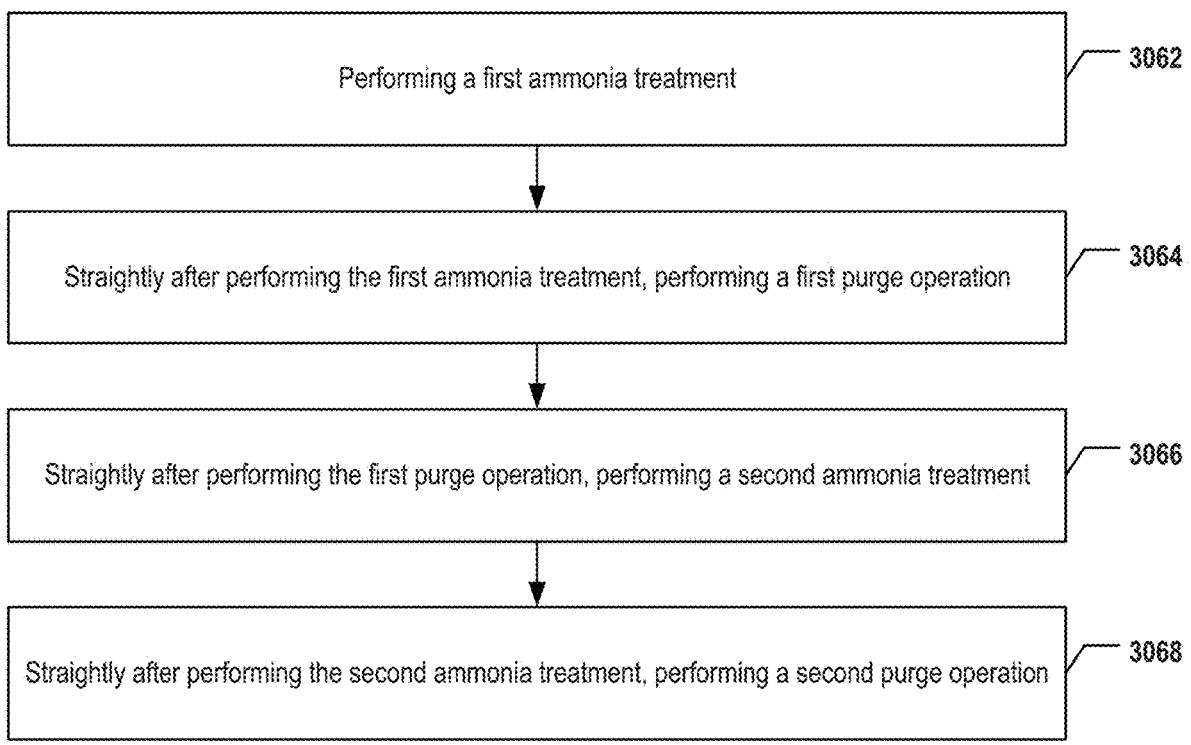

FIGS. 2A-2F illustrate cross-sections of an exemplary semiconductor structure 200, according to some aspects of the present disclosure, and FIGS. 3A-3B are flowcharts of an exemplary method 300 for forming a barrier layer in the semiconductor structure 200, according to some aspects of the present disclosure. For the purpose of better explaining the present disclosure, FIGS. 2A-2F and the flowcharts in FIGS. 3A-3B could be referred to together. In FIG. 2A and operation 302 of FIG. 3A, the semiconductor structure 200 having a dielectric layer 202 is provided. Dielectric layer 202 may be an insulating layer including, but not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In some implementations, dielectric layer 202 may be silicon oxide.

In FIG. 2A and operation 304 of FIG. 3A, dielectric layer 202 is placed in a reaction chamber and is exposed to a precursor 204 having a first metal. Precursor 204 may be $TaCl_5$, $TaF_5$, $TaBr_5$, $TiCl_4$, $TiBr_4$, $TiI_4$ or $TiF_4$. In some implementations, precursor 204 may be $TiCl_4$, and the first metal may be Ti. In some implementations, precursor 204 may be $TaCl_5$, and the first metal may be Ta. As shown in FIG. 2A, precursor 204 is deposited on dielectric layer 202. In some implementations, the substrate and dielectric layer 202 are placed on a heater in the reaction chamber, and a furnace-based process is used to deposit precursor 204 onto dielectric layer 202. In some implementations, in operation 304, the reaction chamber may be provided only precursor 204. In some implementations, in operation 304, when supplying precursor 204 into the reaction chamber, the inert gas, such as dinitrogen ($N_2$), could also be provided in the reaction chamber simultaneously.

As shown in FIG. 2B, after exposing dielectric layer 202 to precursor 204, the gas supply of precursor 204 is stopped, and a precursor purge operation is performed thereafter. During the precursor purge operation, the gas supply of precursor 204 is stopped, and the inert gas supply, such as dinitrogen, is provided in the reaction chamber to bring residual precursor 204 away.

After the precursor purge operation, as shown in FIGS. 2C-2F and operation 306 of FIG. 3A, a pulse-type nitridation operation is performed. FIG. 3B further shows details of the pulse-type nitridation operation. As shown in FIG. 2C and operation 3062 of FIG. 3B, a first ammonia treatment is performed. An ammonia gas 206 is provided in the reaction chamber to react with precursor 204 to form a barrier layer 208. In some implementations, ammonia gas 206 may be $NH_3$, $N_2H_4$, $N_2H_2$, or other suitable ammonia gas. In some implementations, the substrate and dielectric layer 202 are placed on a heater in the reaction chamber, and a furnace-based process is used to form barrier layer 208. By using $TiCl_4$ as precursor 204 and using $NH_3$ as ammonia gas 206 as an example, the chlorine in $TiCl_4$ is replaced by the nitrogen of $NH_3$ and the barrier layer TiN is therefore formed on the dielectric layer. In some implementations, in operation 3062, the reaction chamber may be provided only ammonia gas 206. In some implementations, in operation 3062, when performing the first ammonia treatment by supplying ammonia gas 206 into the reaction chamber, the inert gas, such as dinitrogen, could also be provided and pre-mixed with ammonia gas 206 in a gas line before being supplied to the reaction chamber.

Before supplying ammonia gas 206 into the reaction chamber, an ammonia source, such as an ammonia tank, may be used to store ammonia gas 206. In some implementations, the gas pressure of ammonia gas 206 in the ammonia source may be above 200 Torrs. In some implementations, the gas pressure of ammonia gas 206 may be between 200 Torrs and 250 Torrs. In some implementations, the gas pressure of ammonia gas 206 may be between 210 Torrs and 230 Torrs. In operation 3062, the ammonia source is connected to the reaction chamber by opening a valve between the ammonia source and the reaction chamber, and ammonia gas 206 could be supplied to the reaction chamber. In some implementations, the ammonia source may be pre-mixed with the inert gas in a gas line before the valve, and then be supplied to the reaction chamber by opening the valve. Then, precursor 204 on dielectric layer 202 could react with ammonia gas 206. In some implementations, the processing time of the first ammonia treatment may be less than 0.4 seconds. In some implementations, the processing time of the first ammonia treatment may be between 0.1 and 0.4 seconds. In some implementations, the processing time of the first ammonia treatment may be between 0.2 and 0.4 seconds.

As shown in FIG. 2D and operation 3064 of FIG. 3B, straightly after performing the first ammonia treatment, a first purge operation may be performed. The first purge operation includes disconnecting the ammonia source from the reaction chamber to stop the gas supply of ammonia gas 206, and, at the same time, the inert gas, such as dinitrogen, is still provided to the reaction chamber. It is understood that straightly performing an operation means the operation is performed directly after a previous operation without any intermediate interposition. For example, when performing the first purge operation straightly after performing the first ammonia treatment, no intermediate operation should be inserted in between the first ammonia treatment and the first purge operation.

The first purge operation is used to bring the unnecessary product of operation 3062 away. For example, when using $TiCl_4$ as precursor 204 and using $NH_3$ as ammonia gas 206, the barrier layer TiN could be formed on dielectric layer 202, and a byproduct 210 could be HCl. In the first purge operation, byproduct 210 could be brought away by the inert gas, and barrier layer 208 could be deposited and kept on dielectric layer 202.

Referring to FIG. 2E, after the first purge operation, part of precursor 204 has reacted with ammonia gas 206 and forms barrier layer 208 on dielectric layer 202. However, the remainder of precursor 204 is still on dielectric layer 202 without reacting with ammonia gas 206. As shown in FIG.

2E and operation 3066 of FIG. 3B, straightly after performing the first purge operation, a second ammonia treatment is performed to have ammonia gas 206 reacting with the remainder of precursor 204 on dielectric layer 202. In some implementations, the process of the second ammonia treatment may be similar to the process of the first ammonia treatment, such as the process pressure or the processing time. In some implementations, the process of the second ammonia treatment may be different from the process of the first ammonia treatment.

As shown in FIG. 2F and operation 3068 of FIG. 3B, straightly after performing the second ammonia treatment, a second purge operation may be performed to remove byproduct 210 from semiconductor structure 200 and the reaction chamber. In some implementations, the process of the second purge operation may be similar to the process of the first purge operation, such as the process pressure or the processing time. In some implementations, the process of the second purge operation may be different from the process of the first purge operation.

It is understood that although FIG. 2F shows dielectric layer 202 is fully covered by barrier layer 208 after the second purge operation; however, the actual situation might be different from the ideal one. Therefore, after the second purge operation, more ammonia treatments and purge operations could be added according to the actual requirements. In some implementations, the ammonia treatments and purge operations are repeated three times. In some implementations, the ammonia treatments and purge operations are repeated six times. In some implementations, the ammonia treatments and purge operations are repeated ten times. It should be further noted that, in some implementations, the process including operations 302-306 may be further repeated several times to form a sufficient thickness of barrier layer 208.

In the present disclosure, the pulse-type nitridation process, including the ammonia treatments and the purge operations, is repeated more than once. The repeated pulse-type nitridation operation could gradually remove and scrub the byproduct formed in the ammonia treatments. By repeating the pulse-type nitridation operation, the impurity in the barrier layer is lowered, and the barrier properties are improved.

Figure 4:
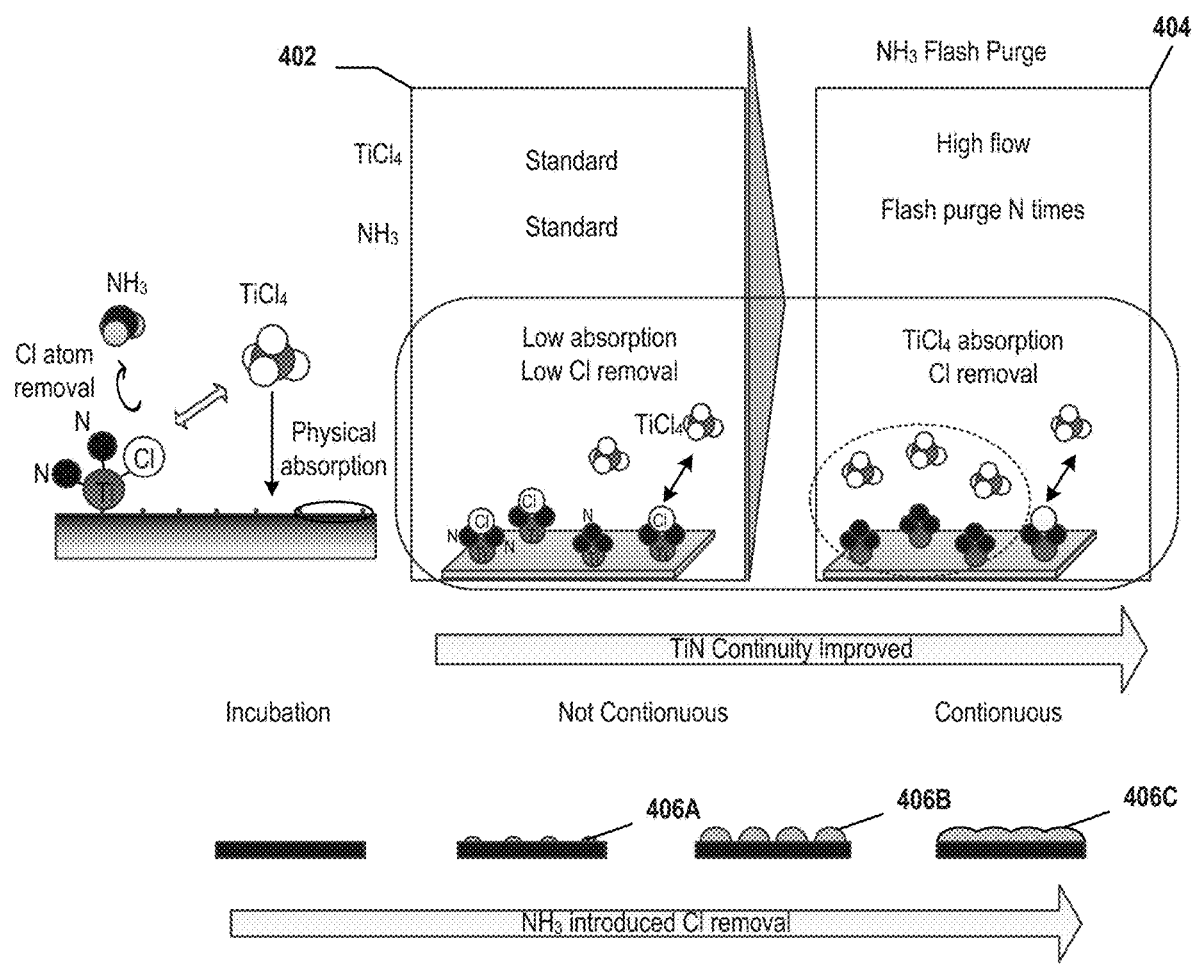
FIG. 4 illustrates another exemplary barrier layer deposition process, according to some aspects of the present disclosure.

FIG. 4 illustrates another exemplary barrier layer deposition process, according to some aspects of the present disclosure. Operation 402 shows the process does not use high flow $TiCl_4$ and pulse-type nitridation operation. Under this situation, the $TiCl_4$ absorption and the removal of the byproduct formed in the ammonia treatments are related low. Operation 404 shows the process using high flow $TiCl_4$ and pulse-type nitridation. According to Langmuir's theory of adsorption (a.k.a. Langmuir adsorption model), when the reaction temperature is fixed, the adsorption and desorption rate of the same gas on the substrate surface will reach an equilibrium status. Therefore, when increasing the $TiCl_4$ flow rate, the overall structure surface of the dielectric layer, including the corners, could be covered by $TiCl_4$, and the adsorption amount is the same. In some implementations, the $TiCl_4$ flow rate in operation 404 may be above 7 cc/cycle. In some implementations, the $TiCl_4$ flow rate in operation 404 may be above 6 cc/cycle. In some implementations, the $TiCl_4$ flow rate in operation 404 may be above 5 cc/cycle.

In the case of adsorbing the same amount of $TiCl_4$, the barrier layer could grow without chlorine when applying the multiple pulse-type nitridation operation of $NH_3$. As shown in operation 404, the chlorine atom removal is increased by applying the multiple pulse-type nitridation operation. Hence the continuity and the barrier properties of the barrier layer are enhanced, and the resistivity is also reduced. FIG. 4 further shows, by increasing times of the pulse-type nitridation operation, the continuity of barrier layer 406A can be improved to barrier layer 406A and then to barrier layer 406C. Therefore, as shown in FIG. 4, barrier layer 406C, such as TiN layer, may have an improved continuity by using high flow $TiCl_4$ and pulse-type nitridation operation.

Figure 5:
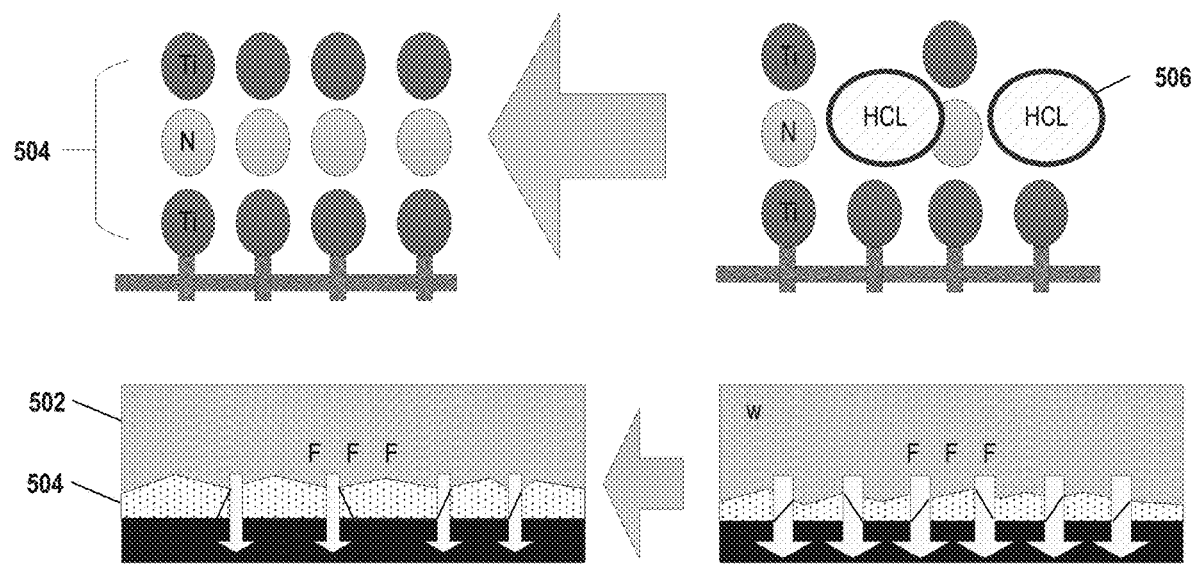
FIG. 5 illustrates another exemplary barrier layer deposition process, according to some aspects of the present disclosure.

FIG. 5 illustrates another exemplary barrier layer deposition process, according to some aspects of the present disclosure. In some implementations, the metal layers or metal lines 502, such as tungsten (W), formed consequent to the barrier layer 504, may use fluorine-containing precursors, such as $WF_6$. The barrier layer is effective as fluorine barriers in the following process. In the present disclosure, using the fresh $NH_3$ gas with multiple flush purges could reduce secondary contamination of the Cl atoms (such as the byproduct HCl 506 shown in FIG. 5) to the barrier layer thin film. In addition, by using multiple high-flow $NH_3$ flushes, the film defects could be reduced or even avoided, because the repeated pulse-type nitridation operation could gradually remove and scrub the byproduct formed in the ammonia treatments and therefore enhance the blocking capability to fluorine.

Figure 6A:
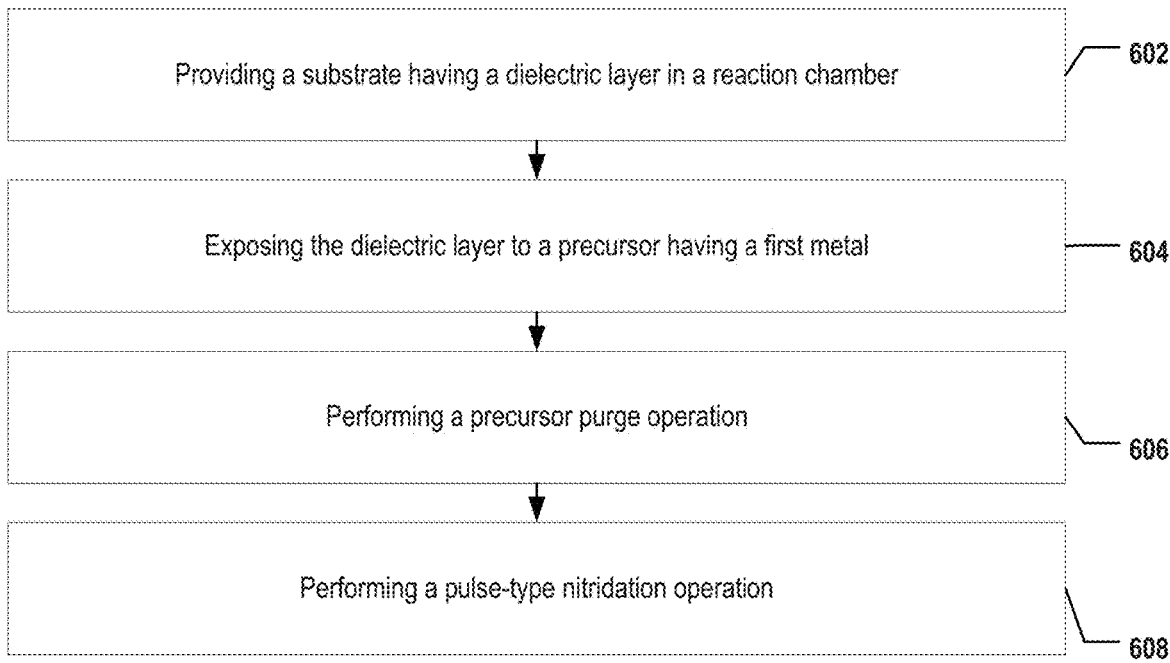
FIGS. 6A-6B are flowcharts of an exemplary method for performing an atomic layer deposition process to form a barrier layer, according to some aspects of the present disclosure.
Figure 6B:
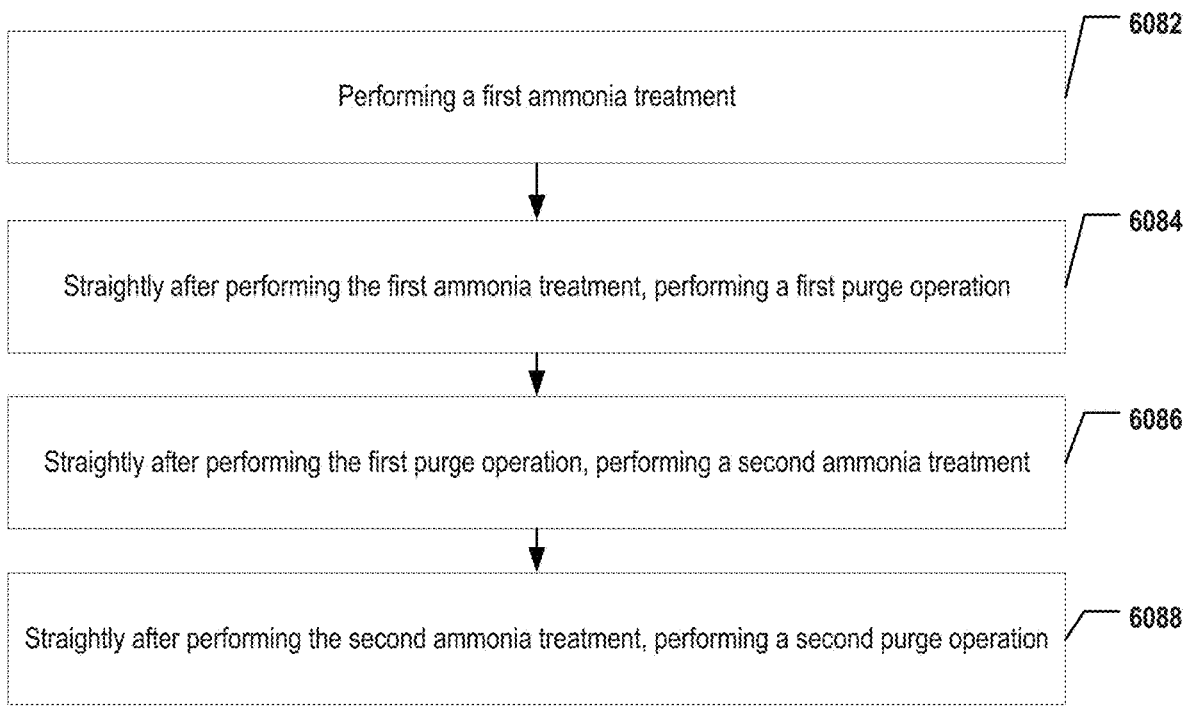

FIGS. 6A-6B are flowcharts of an exemplary method 600 for performing an ALD process to form a barrier layer, according to some aspects of the present disclosure. In operation 602 of FIG. 6A, a substrate having a stack of spaced dielectric layers is provided in a reaction chamber. The stack of spaced dielectric layers may have gaps between the dielectric layers. In some implementations, each gap may be formed a metal line in a later process. In some implementations, the dielectric layers may be silicon oxide. In operation 604, the stack of dielectric layers is exposed to a precursor having a first metal. The precursor may be $TaCl_5$, $TaF_5$, $TaBr_5$, $TiCl_4$, $TiBr_4$, $TiI_4$, or $TiF_4$. In some implementations, the precursor may be $TiCl_4$, and the first metal may be Ti. In some implementations, the precursor may be $TaCl_5$, and the first metal may be Ta. When supplying the precursor into the reaction chamber, the inert gas, such as dinitrogen ($N_2$), could also be provided in the reaction chamber simultaneously. In operation 606, a precursor purge operation is performed. During the precursor purge operation, the gas supply of the precursor is stopped, and the inert gas supply, such as dinitrogen, is still provided in the reaction chamber to bring the residual precursor away. In operation 608, a pulse-type nitridation operation is performed, and FIG. 6B further explains the detailed procedures of the pulse-type nitridation operation of operation 608.

In operation 6082 of FIG. 6B, a first ammonia treatment is performed. In some implementations, during the first ammonia treatment, an ammonia source filling an ammonia gas is provided, and the gas pressure of the ammonia gas may be above 200 Torrs. In some implementations, the gas pressure of the ammonia gas may be between 200 Torrs and 250 Torrs. In some implementations, the gas pressure of the ammonia gas may be between 210 Torrs and 230 Torrs. The ammonia source is connected to the reaction chamber to provide the ammonia gas in the first ammonia treatment when the dielectric layer is exposed to the ammonia gas. In some implementations, the processing time of the first ammonia treatment may be less than 0.4 seconds. In some implementations, the processing time of the first ammonia treatment may be between 0.1 and 0.4 seconds. In some implementations, the processing time of the first ammonia treatment may be between 0.2 and 0.4 seconds.

In operation 6084, straightly after performing the first ammonia treatment, a first purge operation is performed. In some implementations, during the first purge operation, the ammonia source is disconnected from the reaction chamber, and dinitrogen is still provided to the reaction chamber. In operation 6086, straightly after performing the first purge operation, a second ammonia treatment is performed. In some implementations, the process of the second ammonia treatment may be similar to the process of the first ammonia treatment, such as the process pressure or the processing time. In some implementations, the process of the second ammonia treatment may be different from the process of the first ammonia treatment. In operation 6088, straightly after performing the second ammonia treatment, a second purge operation is performed. In some implementations, the process of the second purge operation may be similar to the process of the first purge operation, such as the process pressure or the processing time. In some implementations, the process of the second purge operation may be different from the process of the first purge operation. In some implementations, after performing the second purge operation, more ammonia treatments and purge operations could be added according to the actual requirements. In some implementations, the process including operations 602-608 may be further repeated several times to form a sufficient thickness of the barrier layer.

The semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. As a result, memory density for planar memory cells approaches an upper limit. The three-dimensional (3D) memory device is a device architecture in which memory cells are arranged vertically (three-dimensional), rather than horizontally (planar) to increase memory bit density.

To achieve the goal of increasing memory density, increasing the number of layers of metal lines in a specific thickness plays an important role. When increasing the number of layers of metal lines, the performance of the barrier layers between the metal line and the insulation layer has become an important indicator.

Figure 7A:
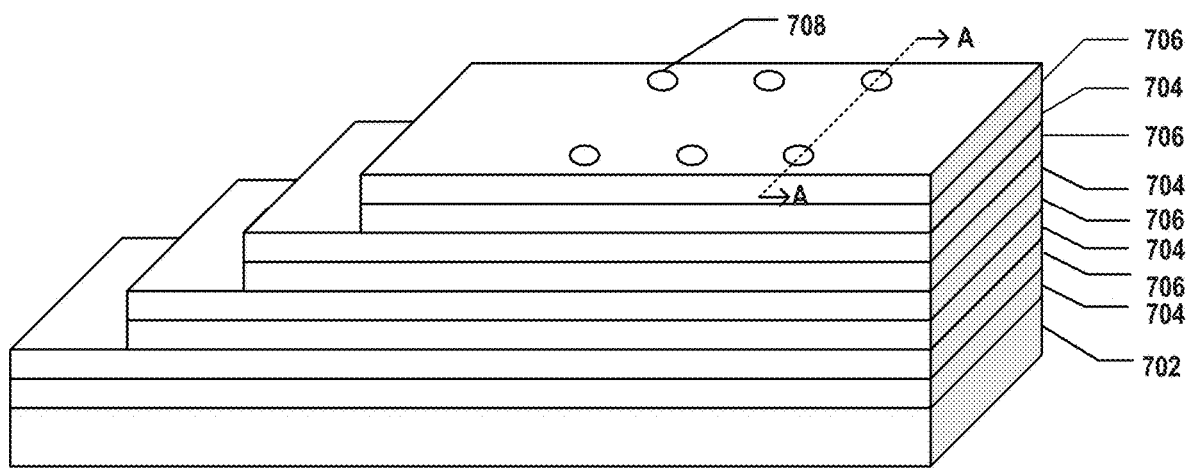
FIGS. 7A-7H illustrate cross-sections of an exemplary semiconductor structure, according to some aspects of the present disclosure.
Figure 7B:
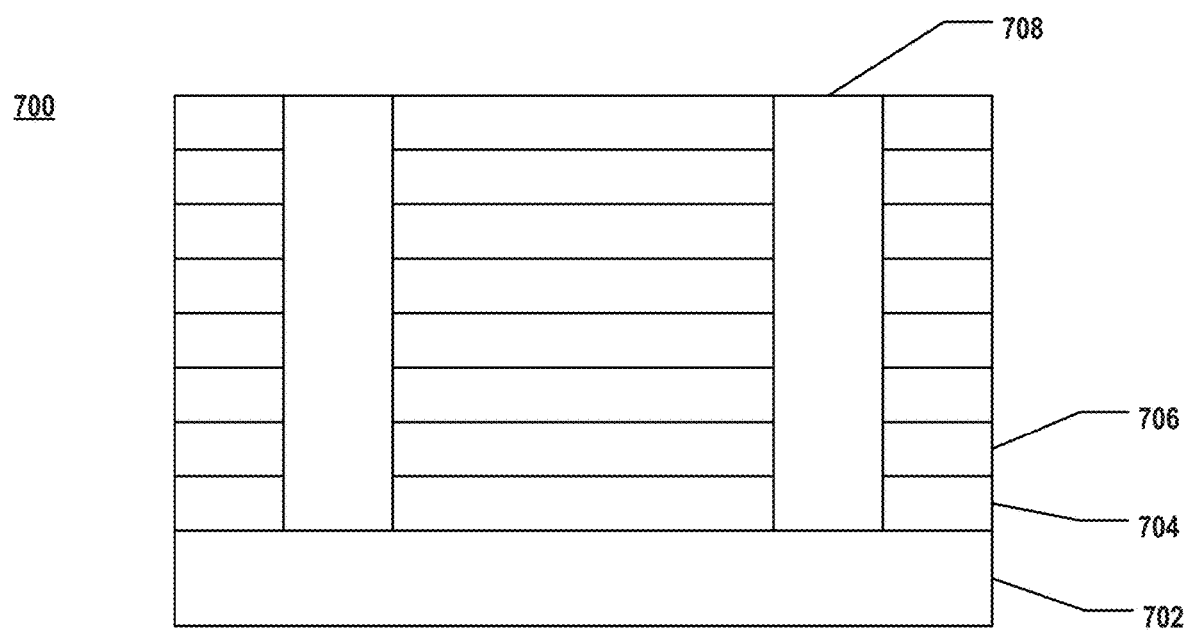

FIGS. 7A-7H illustrate cross-sections of an exemplary semiconductor structure 700, according to some aspects of the present disclosure, and FIGS. 8A-8B are flowcharts of an exemplary method 800 for manufacturing the semiconductor structure 700, according to some aspects of the present disclosure. For the purpose of better explaining the present disclosure, FIGS. 7A-7F and the flowchart in FIGS. 8A and 8B could be referred to together. In FIGS. 7A and 7B and operation 802 of FIG. 8A, a dielectric stack is formed on a substrate 702. FIG. 7B shows a cross-section of semiconductor structure 700 in FIG. 7A along the line AA. The dielectric stack includes a plurality of first dielectric layers 706 and a plurality of second dielectric layers 704, and first dielectric layers 706 and second dielectric layers 704 are alternately formed on substrate 702. Furthermore, at least one channel structure 708 is formed in semiconductor structure 700. Each channel structure 708 can extend vertically through the dielectric stack having interleaved first dielectric layers 706 and second dielectric layers 704.

It is understood that for ease of illustration, the detailed structure of channel structure 708 is not shown in FIGS. 7A-7H. In some implementation, channel structure 708 includes a channel hole filled with a semiconductor layer (e.g., as a semiconductor channel) and a composite dielectric layer (e.g., as a memory film) including a tunneling layer, a storage layer (a.k.a. a charge trap layer), and a blocking layer. First dielectric layers 706 and second dielectric layers 704 may be insulating layers including, but not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In some implementations, the first dielectric layers 706 may be silicon oxide, and the second dielectric layers 704 may be silicon nitride.

Figure 7C:
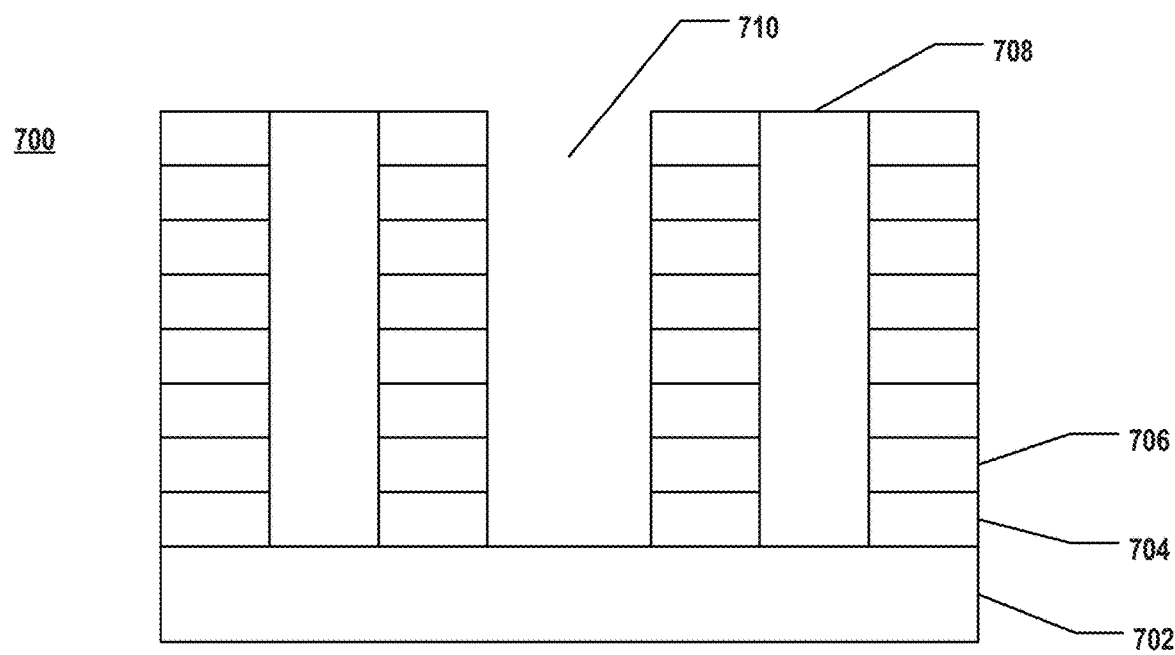
Figure 7D:
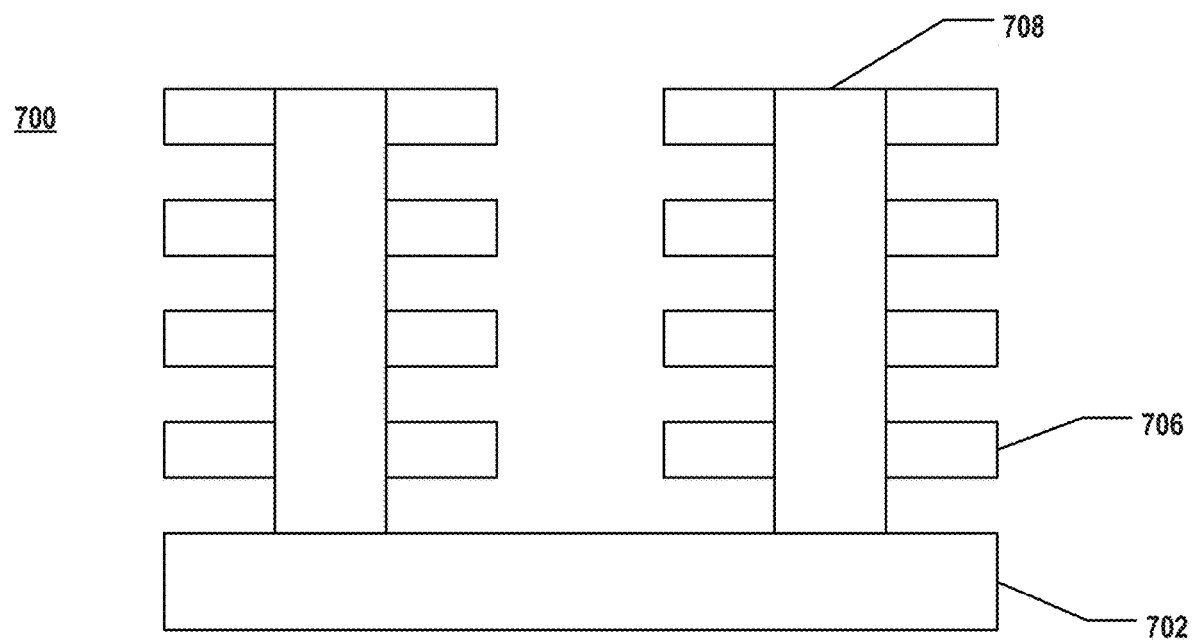

As shown in FIG. 7C and operation 804 of FIG. 8A, a slit 710 is formed in the dielectric stack to vertically separate the dielectric stack to a plurality of arrays. Slit 710 may be formed by any suitable process including, but not limited to, dry etching (e.g., deep reactive ion etch (DRIE)) or wet etching. In FIG. 7D and operation 806 of FIG. 8A, second dielectric layers 704 are removed from the dielectric stack, and first dielectric layers 706 are kept. For example, second dielectric layers 704 may be selectively etched using a wet chemical etchant that has a relatively high selectivity (e.g., above 5) with respect to first dielectric layers 706. In some implementations, the first dielectric layers 706 kept are silicon oxide. After operation 806, the stack of spaced first dielectric layers 706 is formed and has gaps between first dielectric layers 706. In some implementations, each gap may be formed a metal layer 716 in a later process.

Figure 7E:
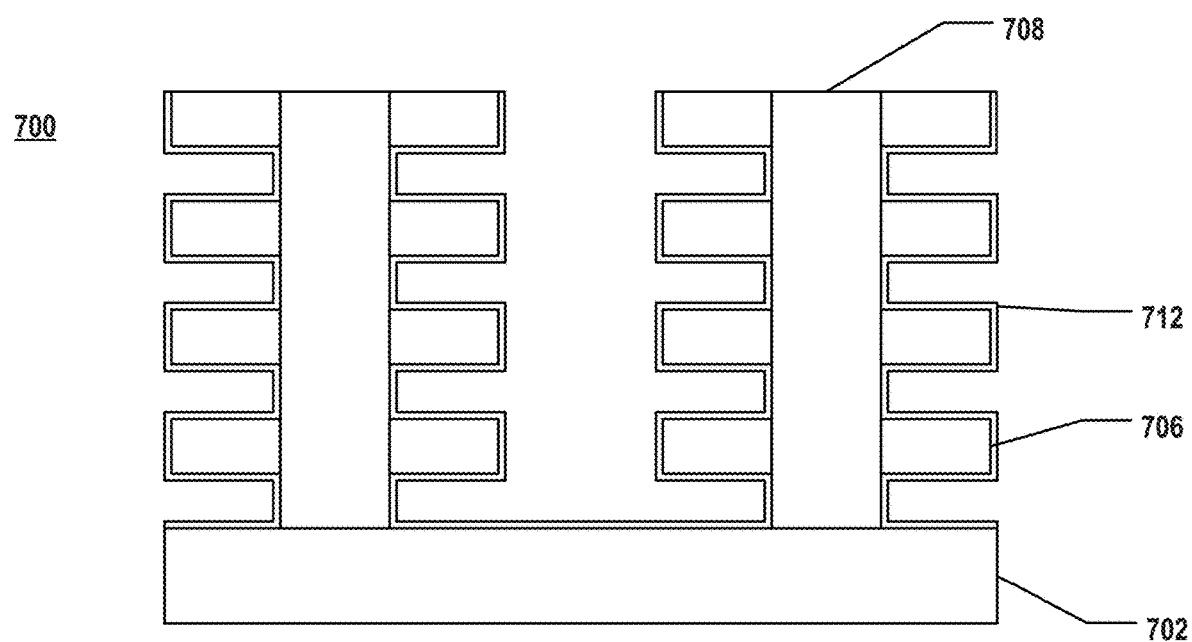

FIG. 7E shows a gate dielectric layer 712 formed on the first dielectric layer 706. Gate dielectric layer 712 may be a dielectric material that functions as a control gate dielectric for the control gates that may be subsequently formed. In some implementations, gate dielectric layer 712 may be silicon dioxide, silicon nitride, silicon oxynitride, other suitable dielectric materials, and/or combinations thereof. In some implementations, gate dielectric layer 712 may be formed by chemical vapor deposition (CVD), atomic layer deposition (ALD), plasma-enhanced CVD (PECVD), plasma-enhanced ALD (PEALD), other suitable processes, and/or combinations thereof.

Figure 7F:
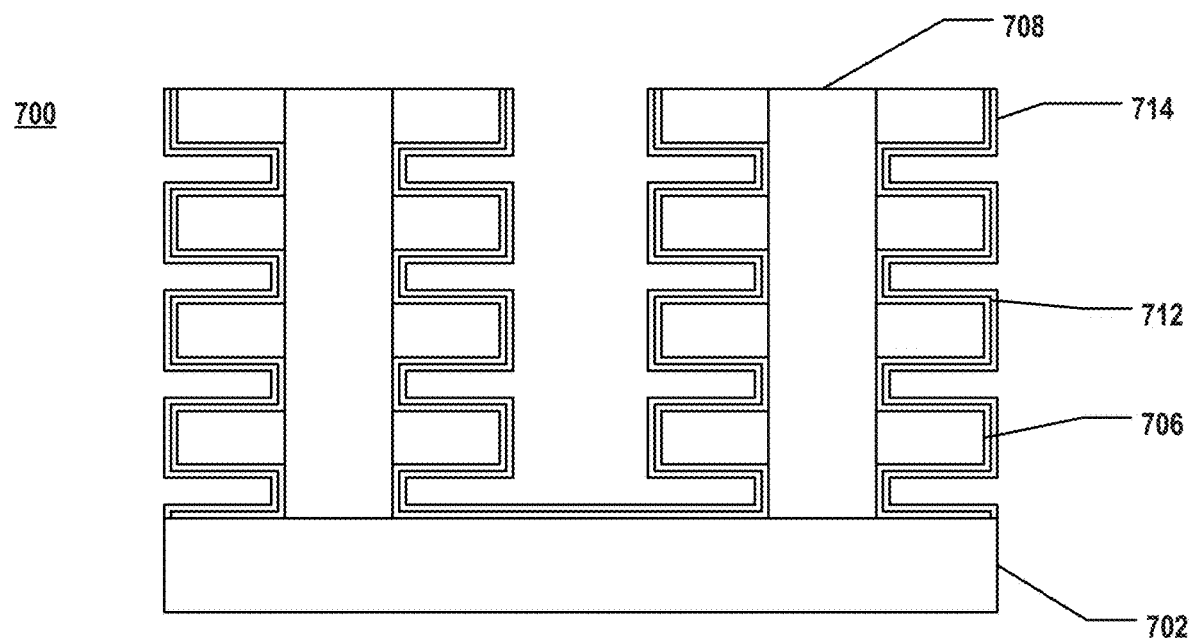

It should be noted that the gate dielectric layer 712 is optional and may be formed or omitted according to actual requirements. Referring to FIG. 7F and operation 808 of FIG. 8A, a first deposition process is performed to form a barrier layer 714 on the first dielectric layers 706 using an atomic layer deposition (ALD) process. Barrier layer 714 is effective as fluorine barriers in the consequent process of forming the metal layers. In case gate dielectric layer 712 is present, barrier layer 714 may be formed directly on gate dielectric layer 712. In case gate dielectric layer 712 is not present, barrier layer 714 may be formed directly on the exposed surfaces of first dielectric layers 706.

FIG. 8B shows the detailed procedures of operation 808 of performing the first deposition process. In operation 8082, the dielectric stack is exposed to a precursor having a first metal. The precursor may be $TaCl_5$, $TaF_5$, $TaBr_5$, $TiCl_4$, $TiBr_4$, $TiI_4$, or $TiF_4$. In some implementations, the precursor may be $TiCl_4$, and the first metal may be Ti. In some implementations, the precursor may be $TaCl_5$, and the first metal may be Ta. In operation 8084, a plurality of pulse-type nitridation operations are performed to form the barrier layer on the first dielectric layers. Each of the plurality of pulse-type nitridation operations includes performing a first ammonia treatment and performing a first purge operation. In some implementations, during the first ammonia treatment, an ammonia source filling an ammonia gas is provided, and the gas pressure of the ammonia gas may be above 200 Torrs. In some implementations, the gas pressure of the ammonia gas may be between 200 Torrs and 250 Torrs. In some implementations, the gas pressure of the ammonia gas may be between 210 Torrs and 230 Torrs. The ammonia source is connected to the reaction chamber to provide the ammonia gas in the first ammonia treatment when first dielectric layers 706 are exposed to the ammonia gas. In some implementations, the processing time of the first ammonia treatment may be less than 0.4 seconds. In some implementations, the processing time of the first ammonia treatment may be between 0.1 and 0.4 seconds. In some implementations, the processing time of the first ammonia treatment may be between 0.2 and 0.4 seconds. Straightly after performing the first ammonia treatment, a first purge operation is performed. In some implementations, during the first purge operation, the ammonia source is disconnected from the reaction chamber, and dinitrogen is provided to the reaction chamber. In some implementations, the process including operations 8082-8084 may be further repeated several times to form a sufficient thickness of barrier layer 714.

Figure 7G:
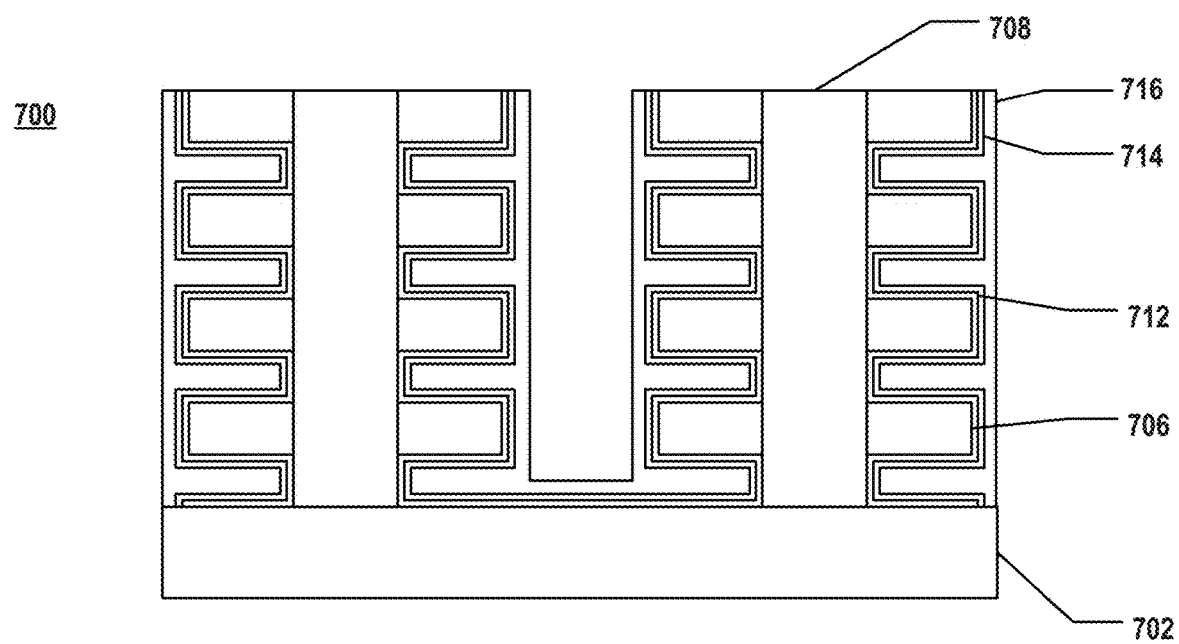
Figure 7H:
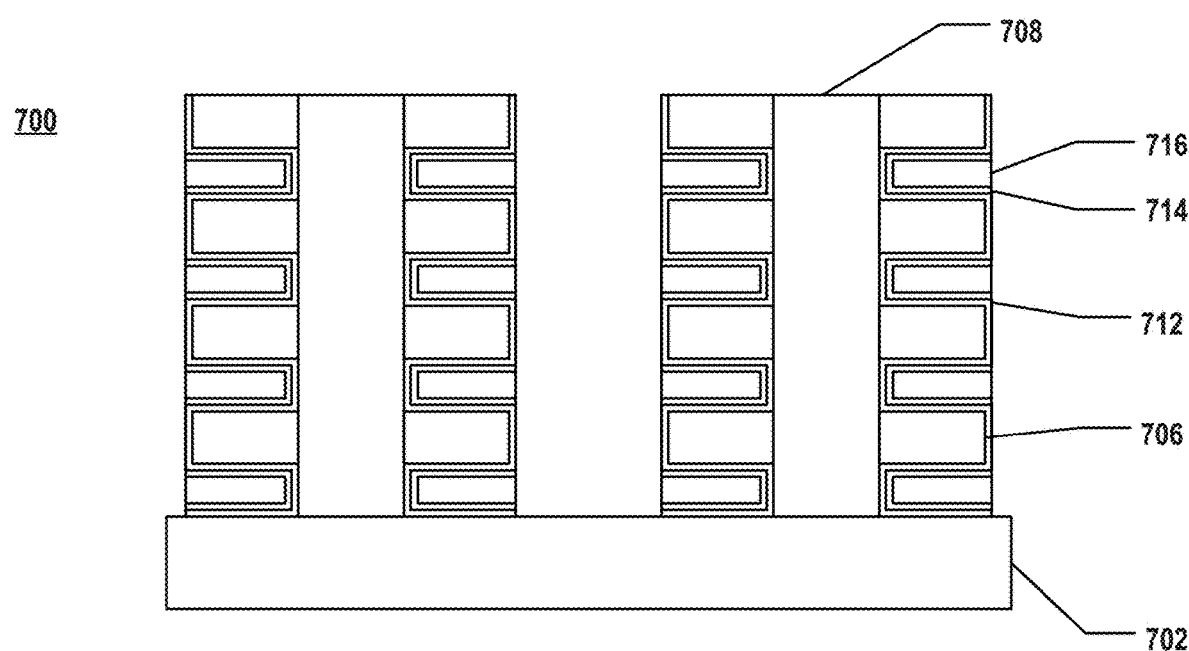

As shown in FIG. 7G, after performing the first deposition process to form barrier layer 714, a metal layer 716 may be formed on barrier layer 714. In FIG. 7H, an etching back process may be performed to remove partials of gate dielectric layer 712, barrier layer 714, and metal layer 716 to form the metal lines in between first dielectric layers 706.

Figure 9A:
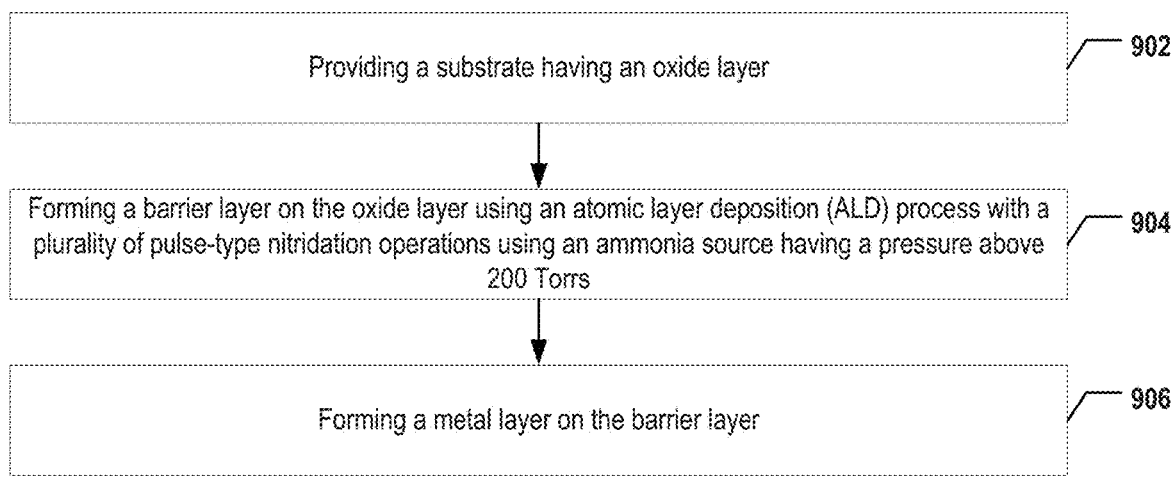
FIGS. 9A-9B are flowcharts of an exemplary method for forming a semiconductor device, according to some aspects of the present disclosure.
Figure 9B:
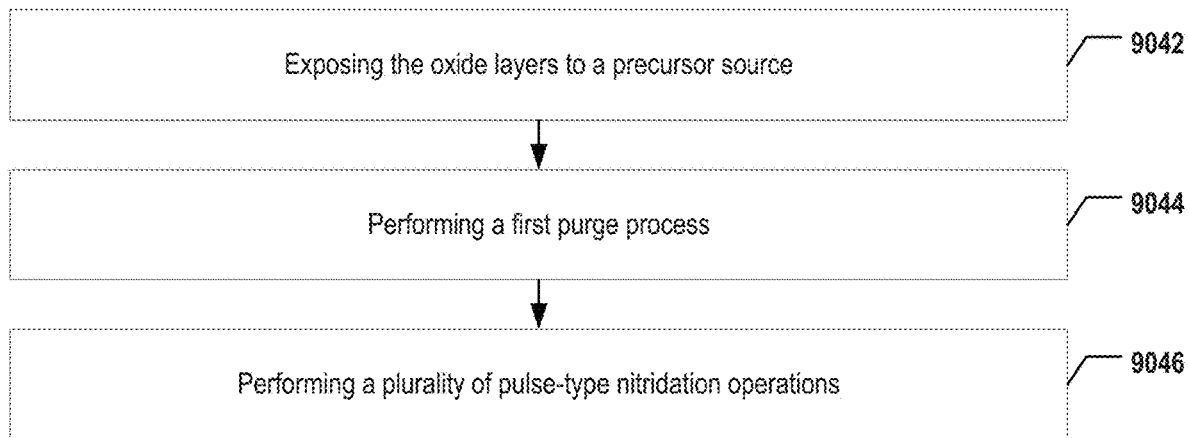

FIGS. 9A-9B are flowcharts of an exemplary method 900 for forming a semiconductor device, according to some aspects of the present disclosure. In operation 902, a substrate having an oxide layer is provided. In some implementations, the semiconductor device is a 3D memory device, and the substrate has a stack of spaced oxide layers with gaps between the oxide layers. In some implementations, each gap is capable of forming a word line in a later process. In operation 904, a barrier layer is formed on the oxide layer using an atomic layer deposition (ALD) process with a plurality of pulse-type nitridation operations using an ammonia source having a pressure above 200 Torrs. Furthermore, operations 9042-9046 of FIG. 9B show the detailed procedures of operation 904.

In operation 9042, the oxide layers are exposed to a precursor source. In some implementations, the precursor source may be titanium tetrachloride (TiCl$_4$). Then, in operation 9044, a first purge process is performed to bring the residual TiCl$_4$ away. It should be noted that TiCl$_4$ functions as a precursor having a first metal used by the process. In some implementations, TiCl$_4$ could be replaced by other precursors, such as TaCl$_5$, TaF$_5$, TaBr$_5$, TiBr$_4$, TiI$_4$, or TiF$_4$. In operation 9046, a plurality of pulse-type nitridation operations are performed. Each of the plurality of pulse-type nitridation operations includes performing an ammonia treatment and a second purge operation. The ammonia treatment is performed by providing an ammonia gas on the oxide layer to react with TiCl$_4$ on the oxide layer. The ammonia treatment is a pulse-type process including providing high-pressure ammonia gas to the reaction chamber in a short reaction time. In some implementations, the pulse type process includes using high-pressure NH$_3$ higher than 200 Torr, and the processing time of the first ammonia treatment may be less than 0.4 seconds. The second purge operation is performed to remove the product after the ammonia treatment. In some implementations, the process including operations 9042-9046 may be further repeated several times to form a sufficient thickness of the barrier layer. Then, after forming the barrier layer, as shown in operation 906 of FIG. 9A, a metal layer is formed on the barrier layer. The metal layer could be further formed a metal line of the 3D memory device in a later process.

Figure 10:
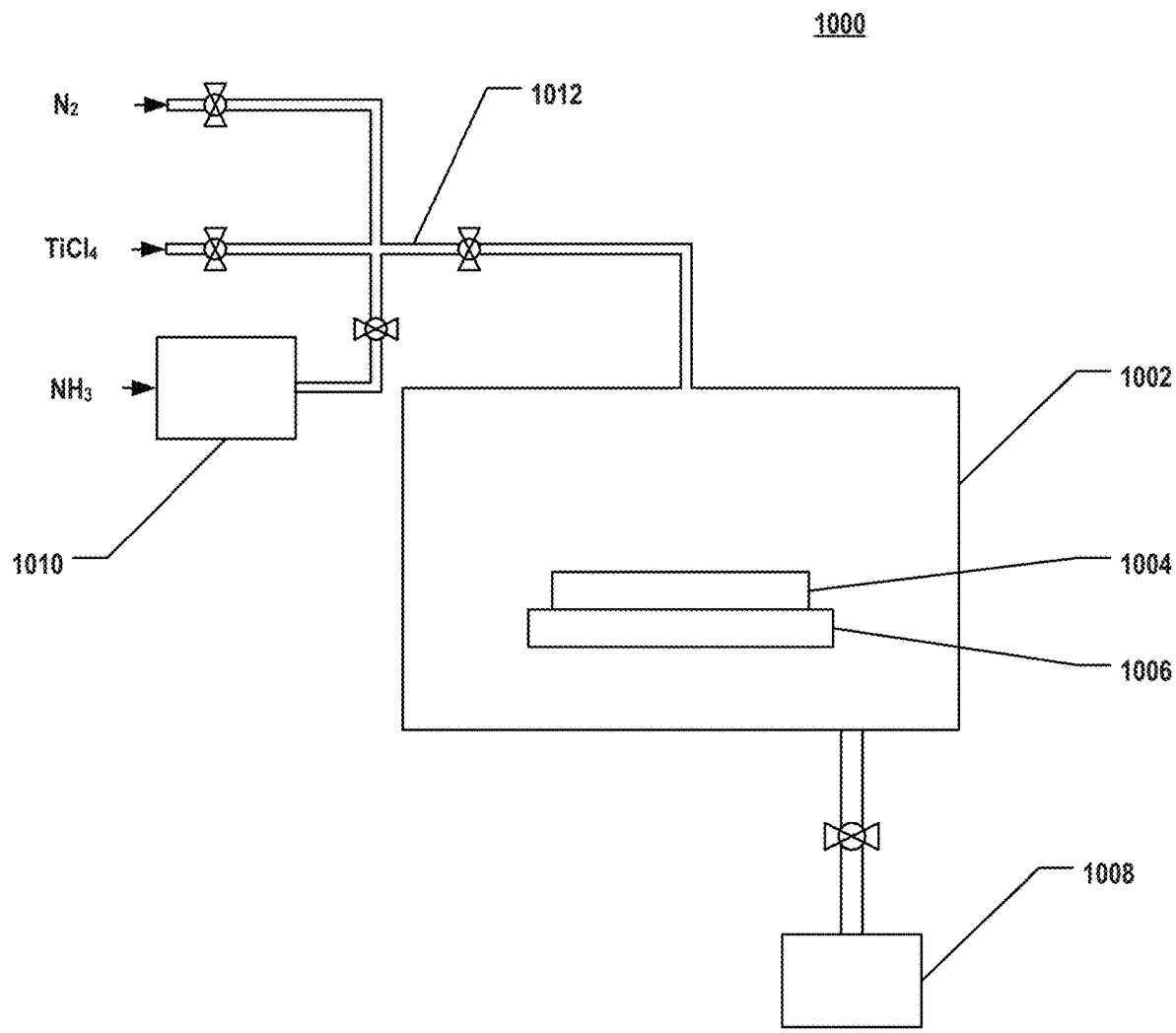
FIG. 10 illustrates an exemplary semiconductor manufacturing device according to some aspects of the present disclosure.

FIG. 10 illustrates a semiconductor manufacturing device 1000 according to some aspects of the present disclosure. Semiconductor manufacturing device 1000 includes a reaction chamber 1002 having a substrate holder 1006 therein to hold a substrate 1004. In some implementations, substrate holder 1006 may be a heater to maintain the reaction temperature of substrate 1004. In some implementations, substrate 1004 may be a wafer and some semiconductor devices may be formed on substrate 1004. Semiconductor manufacturing device 1000 also includes an evacuation unit 1008 to maintain the reaction pressure in reaction chamber 1002. In some implementations, evacuation unit 1008 may be a vacuum pump including a pressure control valve. Semiconductor manufacturing device 1000 further includes a reaction gas supplying system including a precursor source, an ammonia source 1010, and a dinitrogen source connecting to reaction chamber 1002 through a gas line 1012. FIG. 10 illustrates that the precursor source, ammonia source 1010, and the dinitrogen source are connected to reaction chamber 1002 through the same gas line 1012. However, it is understood that the precursor source and the dinitrogen source may be connected to one gas line and ammonia source 1010, and the dinitrogen source may be connected to another gas line. The amount of the gas lines is not limited here.

Ammonia source 1010 is filled with ammonia gas having a pressure above 200 Torrs. In some implementations, the gas pressure of ammonia gas may be between 200 Torrs and 250 Torrs. In some implementations, the gas pressure of ammonia gas may be between 210 Torrs and 230 Torrs.

In some implementations, the precursor source, ammonia source 1010, and the dinitrogen source are the reaction gases of an ALD process to form a dielectric layer on substrate 1004. In some implementations, the precursor source may be titanium tetrachloride (TiCl$_4$), and the barrier layer may be titanium nitride (TiN). In some implementations, ammonia source 1010 and the dinitrogen source are used to perform a plurality of pulse-type nitridation operations in the ALD process.

The pulse-type nitridation operation includes an ammonia treatment and a purge operation. In the ammonia treatment, ammonia source 1010 and the dinitrogen source are provided to the reaction chamber to react with the precursor deposited on substrate 1002. In some implementations, ammonia source 1010 may be a tank filled with ammonia gas with the pressure above 200 Torrs. In some implementations, the processing time of the ammonia treatment may be between 0.1 and 0.4 seconds. In some implementations, the processing time of the ammonia treatment may be between 0.2 and 0.4 seconds. In some implementations, ammonia source 1010 is filled with an ammonia gas with the pressure above 200 Torrs, and the dinitrogen is mix with the ammonia gas in gas line 1012 in the ammonia treatment.

After the ammonia treatment, a purge operation may be performed by disconnecting ammonia source 1010 to stop the gas supply of ammonia gas, and, at the same time, the dinitrogen source is still provided to reaction chamber 1002. The pulse-type nitridation operation includes repeating the ammonia treatment and the purge operation several times to bring away the byproduct and keep the barrier layer on substrate 1004. FIG. 10 illustrates TiCl$_4$ as the precursor source and NH$_3$ as the ammonia gas. However, it is understood that TiCl$_4$ and NH$_3$ could be replaced by other precursor sources and ammonia gas, as explained above and are not limited here.

According to one aspect of the present disclosure, a method for forming a barrier layer in a semiconductor structure is provided. A substrate having a dielectric layer is provided. The dielectric layer is exposed to a precursor having a first metal, and a pulse-type nitridation operation is performed. During the pulse-type nitridation operation, a first ammonia treatment is performed. A first purge operation is performed, a second ammonia treatment is performed after the first purge operation, and a second purge operation is performed after the second ammonia treatment to form the barrier layer on the dielectric layer.

In some implementations, after performing the second purge operation, a third ammonia treatment is performed. In some implementations, after performing the third ammonia treatment, a third purge operation is performed. In some implementations, exposing the dielectric layer to the precursor having the first metal and performing the pulse-type operation are repeated to increase the thickness of the barrier layer. In some implementations, after exposing the dielectric layer to the precursor having the first metal, a precursor purge operation is performed.

In some implementations, when performing the first ammonia treatment, an ammonia source filling an ammonia gas with a pressure above 200 Torrs is provided, the ammonia source is connected to a reaction chamber containing the dielectric layer, and the dielectric layer is exposed to the ammonia gas. In some implementations, when performing the first ammonia treatment, an ammonia source filling an ammonia gas with a pressure above 200 Torrs is provided, dinitrogen (N$_2$) is provided to mix with the ammonia source in a gas line, the mixed ammonia source and dinitrogen is connected to a reaction chamber containing the dielectric layer, and the dielectric layer is exposed to the mixed ammonia source and dinitrogen. In some implementations, when performing the first purge operation, the ammonia source is disconnected from the reaction chamber, and dinitrogen (N$_2$) is provided to the reaction chamber.

In some implementations, when performing the second ammonia treatment, the ammonia source filling an ammonia gas with the pressure above 200 Torrs is provided, the ammonia source is connected to the reaction chamber, and the dielectric layer is exposed to the ammonia gas.

In some implementations, the precursor is titanium tetrachloride (TiCl$_4$), the first metal is titanium (Ti), and the barrier layer is titanium nitride (TiN). In some implementations, the precursor is tantalum penta-chloride (TaCl$_5$), the first metal is tantalum (Ta), and the barrier layer is tantalum nitride (TaN).

According to another aspect of the present disclosure, a method for manufacturing a three-dimensional (3D) memory device is disclosed. A dielectric stack is formed on a substrate, the dielectric stack includes a plurality of first dielectric layers and a plurality of second dielectric layers, and the first dielectric layers and the second dielectric layers are alternately formed on the substrate. A slit is formed in the dielectric stack to vertically separate the dielectric stack to a plurality of arrays. The second dielectric layers in the dielectric stack are removed, and a first deposition process is performed to form a barrier layer on the first dielectric layers using an atomic layer deposition (ALD) process. The ALD process includes the dielectric stack exposed to a precursor having a first metal, and a plurality of pulse-type nitridation operations performed to form the barrier layer on the first dielectric layers.

In some implementations, the ALD process includes exposing the dielectric stack to a precursor having a first metal and performing a plurality of pulse-type nitridation operations to form the barrier layer on the first dielectric layers. In some implementations, each of the plurality of pulse-type nitridation operations includes performing an ammonia treatment using the ammonia source with the pressure above 200 Torrs and, straightly after performing the ammonia treatment, performing a purge operation.

In some implementations, after exposing the dielectric stack to the precursor having the first metal, a precursor purge operation is performed. In some implementations, after performing the first deposition process, the first deposition process is repeated to increase the thickness of the barrier layer. In some implementations, the first dielectric layers are silicon oxide layers, and the second dielectric layers are silicon nitride layers.

In some implementations, the precursor is titanium tetrachloride (TiCl$_4$), the first metal is titanium (Ti), and the barrier layer is titanium nitride (TiN). In some implementations, the precursor is tantalum penta-chloride (TaCl$_5$), the first metal is tantalum (Ta), and the barrier layer is tantalum nitride (TaN).

In some implementations, when performing the ammonia treatment, an ammonia source filling an ammonia gas with a pressure above 200 Torrs is provided, the ammonia source is connected to a reaction chamber containing the dielectric layer, and the dielectric layer is exposed to the ammonia gas for less than 0.4 seconds. In some implementations, the reaction chamber is further filled with dinitrogen (N$_2$). In some implementations, when performing the first ammonia treatment, an ammonia source filling an ammonia gas with a pressure above 200 Torrs is provided, dinitrogen (N$_2$) is provided to mix with the ammonia source in a gas line, the mixed ammonia source and dinitrogen is connected to a reaction chamber containing the dielectric layer, and the dielectric layer is exposed to the mixed ammonia source and dinitrogen. In some implementations, when performing the purge operation, the ammonia source is disconnected from the reaction chamber, and dinitrogen is provided to the reaction chamber.

According to still another aspect of the present disclosure, a method for forming a semiconductor device is disclosed. A substrate is provided. A barrier layer is formed on the substrate using an atomic layer deposition (ALD) process with a plurality of pulse-type nitridation operations.

In some implementations, during the ALD process, the substrate is exposed to a precursor source, a first purge process is performed, and a plurality of pulse-type nitridation operations are performed. In some implementations, the method repeats exposing the substrate to the precursor source, performing the first purge process, and performing the plurality of pulse-type nitridation operations to increase the thickness of the barrier layer.

In some implementations, each of the plurality of pulse-type nitridation operations includes performing an ammonia treatment by providing the ammonia source having the pressure above 200 Torrs to the oxide layers and performing a second purge process.

In some implementations, when exposing the substrate to the precursor source, the precursor source and dinitrogen are provided to a reaction chamber containing the substrate. In some implementations, when exposing the substrate to the precursor source, titanium tetrachloride (TiCl$_4$) is provided to a reaction chamber containing the substrate. In some implementations, when performing the first purge process, the precursor source supply is stopped, and dinitrogen is provided to the reaction chamber.

In some implementations, when performing the ammonia treatment, an ammonia source filling an ammonia gas with a pressure above 200 Torrs is provided, the ammonia source is connected to the reaction chamber containing the substrate and dinitrogen, and the substrate is exposed to the ammonia gas. In some implementations, when performing the first ammonia treatment, an ammonia source filling an ammonia gas with a pressure above 200 Torrs is provided, dinitrogen ($N_2$) is provided to mix with the ammonia source in a gas line, the mixed ammonia source and dinitrogen is connected to a reaction chamber containing the substrate, and the substrate is exposed to the mixed ammonia source and dinitrogen. In some implementations, the barrier layer is titanium nitride (TiN), and the substrate includes an oxide layer. In some implementations, the semiconductor device is a 3D memory device, and the substrate has a stack of spaced oxide layers with gaps between the oxide layers.

According to still another aspect of the present disclosure, a semiconductor manufacturing device is disclosed. The semiconductor manufacturing device includes a reaction chamber, a substrate holder located in the reaction chamber to hold a substrate, a precursor source connected to the reaction chamber through a gas line, an ammonia source with a pressure above 200 Torrs connected to the reaction chamber through the gas line, and a dinitrogen source connected to the reaction chamber through the gas line. The precursor source, the ammonia source, and the dinitrogen source are configured to implement an atomic layer deposition (ALD) process to form a barrier layer on the substrate, and the ammonia source and the dinitrogen source are configured to implement a plurality of pulse-type nitridation operations in the ALD process.

In some implementations, the ammonia source and the dinitrogen source are provided to the reaction chamber and are configured to perform an ammonia treatment on the substrate, and the dinitrogen source is provided to the reaction chamber and is configured to perform a purge operation. The ammonia source and the dinitrogen source are configured to perform the ammonia treatment and the purge operation more than once.

In some implementations, the ammonia source is filled with an ammonia gas with the pressure above 200 Torrs, and the dinitrogen is mix with the ammonia gas in the gas line in the pulse-type nitridation operation. In some implementations, the precursor source is titanium tetrachloride ($TiCl_4$), and the barrier layer is titanium nitride (TiN).

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a barrier layer in a semiconductor structure, comprising:
   providing a substrate having a dielectric layer;
   exposing the dielectric layer to a precursor having a first metal; and
   performing a pulse-type nitridation operation, comprising:
   performing a first ammonia treatment through providing an ammonia gas;
   performing a first purge operation;
   straightly after performing the first purge operation, performing a second ammonia treatment; and
   straightly after performing the second ammonia treatment, performing a second purge operation to form the barrier layer on the dielectric layer.

2. The method of claim 1, wherein the pulse-type nitridation operation further comprises:
   after performing the second purge operation, performing a third ammonia treatment; and
   performing a third purge operation.

3. The method of claim 1, further comprising:
   repeating exposing the dielectric layer to the precursor having the first metal and performing the pulse-type nitridation operation to increase a thickness of the barrier layer.

4. The method of claim 1, wherein, after exposing the dielectric layer to the precursor having the first metal, further comprising:
   performing a precursor purge operation.

5. The method of claim 1, wherein performing the first ammonia treatment comprises:
   providing an ammonia source filling the ammonia gas with a pressure above 200 Torrs;
   connecting the ammonia source to a reaction chamber containing the dielectric layer; and
   exposing the dielectric layer to the ammonia gas.

6. The method of claim 1, wherein performing the first ammonia treatment comprises:
   providing an ammonia source filling the ammonia gas with a pressure above 200 Torrs;
   providing dinitrogen ($N_2$) to mix with the ammonia gas in a gas line; and
   connecting the mixed ammonia gas and dinitrogen to a reaction chamber and exposing the dielectric layer to the mixed ammonia gas and dinitrogen.

7. The method of claim 1, wherein performing the second ammonia treatment comprises:
   providing an ammonia source filling an ammonia gas with a pressure above 200 Torrs; and
   connecting the ammonia source to a reaction chamber and exposing the dielectric layer to the ammonia gas.

8. The method of claim 1, wherein the precursor is titanium tetrachloride ($TiCl_4$), the first metal is titanium (Ti), and the barrier layer is titanium nitride (TiN).

9. The method of claim 1, wherein the precursor is tantalum penta-chloride ($TaCl_5$), the first metal is tantalum (Ta), and the barrier layer is tantalum nitride (TaN).

10. A method for manufacturing a three-dimensional (3D) memory device, comprising:
    forming a dielectric stack on a substrate, the dielectric stack comprising a plurality of first dielectric layers and a plurality of second dielectric layers, and the first dielectric layers and the second dielectric layers being alternately formed on the substrate;
    forming a slit in the dielectric stack to vertically separate the dielectric stack to a plurality of arrays;
    removing the second dielectric layers in the dielectric stack; and
    performing a first deposition process to form a barrier layer on the first dielectric layers using an atomic layer deposition (ALD) process,
    wherein the ALD process comprises:
    exposing the dielectric stack to a precursor having a first metal; and performing a plurality of pulse-type nitridation operations to form the barrier layer on the first dielectric layers, wherein each of the plurality of pulse-type nitridation operations comprises:
- a first ammonia treatment that ends at time t1 and is performed through providing ammonia gas;
- a first purge operation that starts at time t1 and ends at t2; and
- a second ammonia treatment that starts at t2.

11. The method of claim 10, wherein each of the plurality of pulse-type nitridation operations comprises:
performing the first ammonia treatment using an ammonia source with a pressure above 200 Torrs; and
straightly after performing the first ammonia treatment, performing the first purge operation.

12. The method of claim 10, after exposing the dielectric stack to the precursor having the first metal, further comprising:
performing a precursor purge operation.

13. The method of claim 10, after performing the first deposition process, further comprising:
repeating the first deposition process to increase a thickness of the barrier layer.

14. The method of claim 10, wherein the first dielectric layers are silicon oxide layers, and the second dielectric layers are silicon nitride layers.

15. The method of claim 11, wherein performing the first ammonia treatment comprises:
providing the ammonia source filling the ammonia gas with the pressure above 200 Torrs; and
connecting the ammonia gas to a reaction chamber and exposing the dielectric stack to the ammonia gas for less than 0.4 seconds.

16. The method of claim 11, wherein performing the first ammonia treatment comprises:
providing the ammonia source filling the ammonia gas with the pressure above 200 Torrs;
providing dinitrogen ($N_2$) to mix with the ammonia gas in a gas line; and
connecting the mixed ammonia gas and dinitrogen to a reaction chamber and exposing the dielectric stack to the mixed ammonia gas and dinitrogen for less than 0.4 seconds.

17. A semiconductor manufacturing device, comprising:
a reaction chamber;
a substrate holder located in the reaction chamber to hold a substrate;
a precursor source connected to the reaction chamber through a gas line;
an ammonia source with a pressure above 200 Torrs connected to the reaction chamber through the gas line; and
a dinitrogen source connected to the reaction chamber through the gas line,
wherein the precursor source, the ammonia source, and the dinitrogen source are configured to perform an atomic layer deposition (ALD) process to form a barrier layer on the substrate, and the ammonia source and the dinitrogen source are configured to perform a plurality of pulse-type nitridation operations in the ALD process, wherein each of the plurality of pulse-type nitridation operations comprises a first ammonia treatment, a first purge operation, a second ammonia treatment, and a second purge operation being performed in this order and in a continuous and uninterrupted manner.

18. The semiconductor manufacturing device of claim 17, wherein the ammonia source and the dinitrogen source are configured to perform the plurality of pulse-type nitridation operations in the ALD process, comprises:
the ammonia source and the dinitrogen source being provided to the reaction chamber and configured to perform an ammonia treatment on the substrate; and
the dinitrogen source being provided to the reaction chamber and configured to perform a purge operation,
wherein the ammonia source and the dinitrogen source are configured to perform the first ammonia treatment, the first purge operation, the second ammonia treatment, and the second purge operation.

19. The semiconductor manufacturing device of claim 18, wherein the ammonia source is filled with an ammonia gas with the pressure above 200 Torrs, and the dinitrogen source is mixed with the ammonia gas in the gas line in the first ammonia treatment.

20. The semiconductor manufacturing device of claim 17, wherein the precursor source is titanium tetrachloride ($TiCl_4$), and the barrier layer is titanium nitride (TiN).

* * * * *